United States Patent
Yamamoto et al.

(10) Patent No.: US 7,598,162 B2
(45) Date of Patent: Oct. 6, 2009

(54) METHOD OF MANUFACTURING SEMICONDUCTOR DEVICE

(75) Inventors: Tomonari Yamamoto, Kawasaki (JP); Tomohiro Kubo, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 204 days.

(21) Appl. No.: 11/526,882

(22) Filed: Sep. 26, 2006

(65) Prior Publication Data

US 2007/0072355 A1     Mar. 29, 2007

Related U.S. Application Data

(63) Continuation-in-part of application No. 11/302,197, filed on Dec. 14, 2005, now abandoned.

(30) Foreign Application Priority Data

Sep. 28, 2005 (JP) ............... 2005-282652
Sep. 15, 2006 (JP) ............... 2006-251373

(51) Int. Cl.
*H01L 21/425* (2006.01)
(52) U.S. Cl. ............ 438/528; 438/520; 438/521; 438/529; 257/E21.002
(58) Field of Classification Search ......... 438/520, 438/521, 528, 529
See application file for complete search history.

(56) References Cited

U.S. PATENT DOCUMENTS

RE37,158 E * 5/2001 Lee ............ 438/289
6,391,731 B1 * 5/2002 Chong et al. ........... 438/303
6,770,519 B2     8/2004 Ito et al.
6,897,118 B1 * 5/2005 Poon et al. ............. 438/303
7,432,146 B2 * 10/2008 Tomonari ............ 438/197
2004/0004250 A1    1/2004 Momiyama et al.

FOREIGN PATENT DOCUMENTS

KR    2001-0065303 A    7/2001
KR    2004-0010366 A    1/2004

* cited by examiner

*Primary Examiner*—Zandra Smith
*Assistant Examiner*—Christy L Novacek
(74) *Attorney, Agent, or Firm*—Westerman, Hattori, Daniels & Adrian, LLP.

(57) ABSTRACT

It is an object to provide a method of manufacturing a semiconductor device capable of forming a MOS transistor of high performance, comprising the steps of forming a gate electrode on a semiconductor substrate via a gate-insulating film (step S1), introducing a impurity into the semiconductor substrate using the gate electrode as a mask (step S7), introducing a diffusion-controlling substance into the semiconductor substrate to control the diffusion of the impurity (step S8), forming a side wall-insulating film on each side surface of the gate electrode (step S9), deeply introducing impurity into the semiconductor substrate using the gate electrode and the side wall-insulating film as masks (step S10), activating the impurity by the annealing treatment using a rapid thermal annealing method (step S11), and further activating the impurity by the millisecond annealing treatment (step S12).

22 Claims, 26 Drawing Sheets

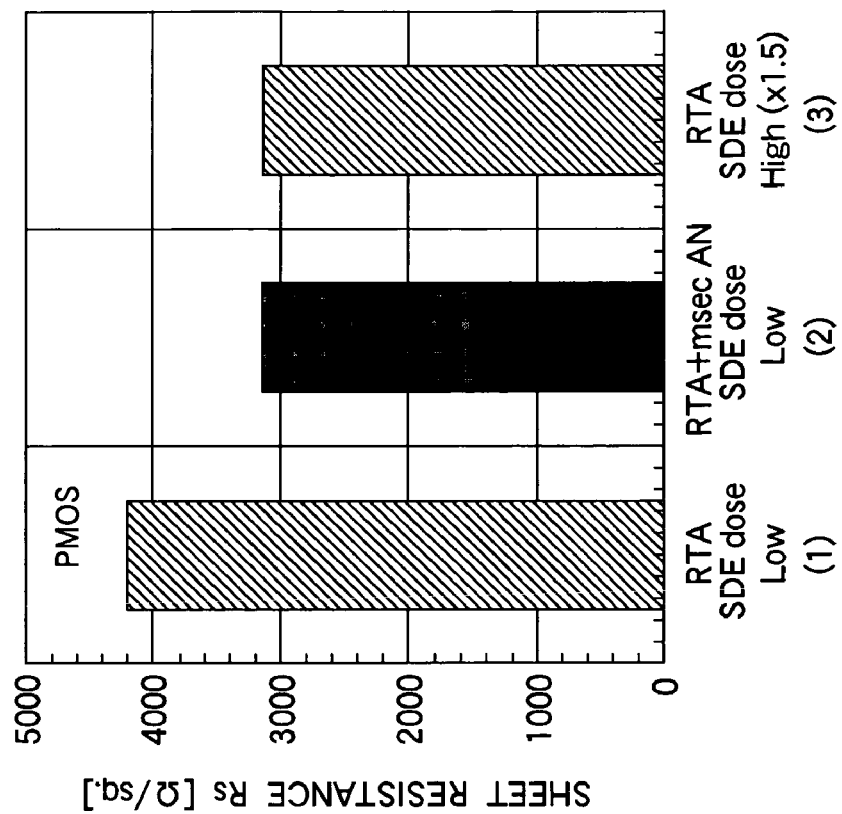
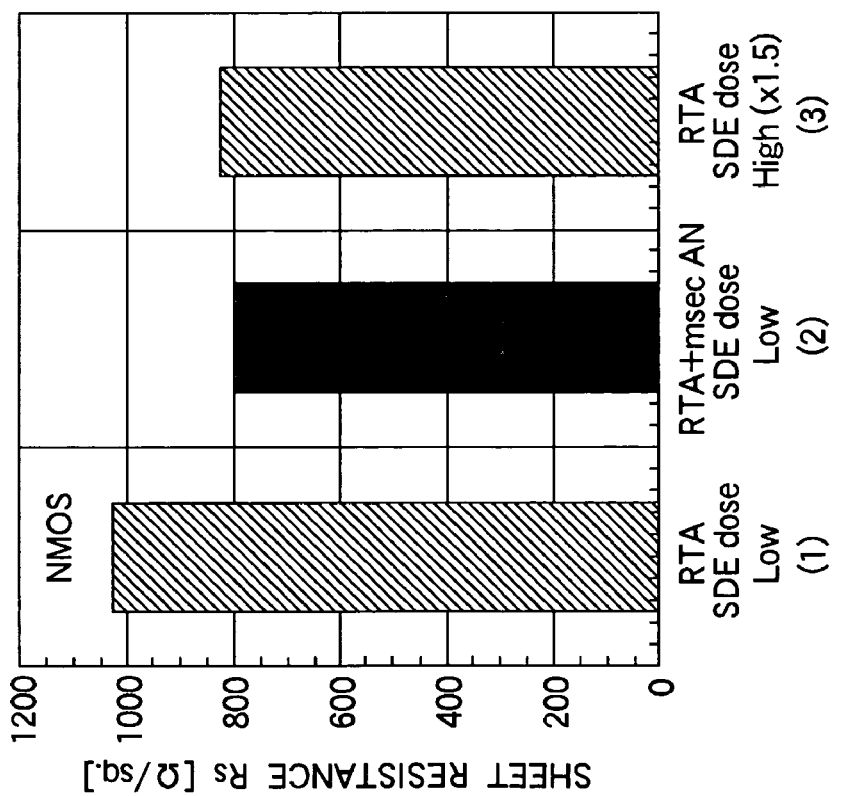
FIG. 11A
FIG. 11B

METHOD OF MANUFACTURING SEMICONDUCTOR DEVICE

CROSS REFERENCE TO RELATED APPLICATIONS

This application is a continuation-in-part of Ser. No. 11/302,197, filed Dec. 14, 2005.

BACKGROUND OF THE INVENTION

1. Field of the Invention

This invention relates to a method of manufacturing a semiconductor device provided with a MOS (metal oxide semiconductor) transistor having a source/drain extension structure.

2. Background Art

In recent years a laser annealing technology has been expected as a heat process of the next generation to substitute for the rapid thermal annealing. This technology is a non-equilibrium heat process which is a melt recrystallization process in a period of time which is as very short as several nanoseconds, offering such advantages as a high electric activity in excess of a limit of solid solution of impurity in a semiconductor that is usually limited by the temperature and a steep impurity profile and making it possible to form source/drain of low contact resistances and more shallow and more steep impurity diffusion (extension) regions.

In order to enhance the performance of a fine CMOS transistor having a further shortened gate length, it is necessary to lower the source/drain parasitic resistances. The source/drain parasitic resistances can be roughly divided into four components; i.e., overlap resistance Rov occurring at an end portion overlapping the lower layer of the gate electrode via a gate-insulating film in the extension region, extension resistance Rext occurring in the extension region, deep source/drain resistance Rdp occurring in the deep source/drain region, and contact-junction resistance Rco occurring between the deep source/drain region and the silicide film.

[Patent document 1] JP-A-2004-235603
[Patent document 2] JP-A-2004-152888
[Non-patent document 1] Somit Talwar and David Markle, "Junction scaling using lasers for thermal annealing", in Solid State Tech., July 2003, pp. 83-86
[Non-patent document 2] A. Shima, Y. Wang, S. Talwar, and A. Hiraiwa, "Ultra-shallow junction formation by non-melt laser spike annealing for 50-nm gate CMOS", in VLSI Symp. Tech. Dig., 2004, pp. 174-175
[Non-patent document 3] T. Ito, K. Suguro, M. Tamura, T. Taniguchi, Y. Ushiku, T. Iinuma, T. Itani, M. Yoshioka, T. Owada, Y. Imakoka, H. Murayama, and T, Kusuda, "Flash lamp annealing technology for ultra-shallow junction formation", in Junction Technology, 2002, IWJT. Extended Abstracts of the Third International Workshop on 2-3 Dec. 2002, pp. 23-26

In order to decrease the resistances Rext, Rdp and Rco by highly activating the impurity, the annealing treatment may be effected at a high temperature after the impurity has been injected. However, the annealing treatment at a high temperature, at the same time, causes the impurity to be diffused. A concentration profile of impurity in the transverse direction is, generally, dominated by a phenomenon of diffusion. Therefore, if the annealing treatment is effected being heated at a high temperature, a steep concentration profile is not obtained and, besides, the resistance Rov increases. If the annealing treatment is effected at such a low temperature as to obtain a steep concentration profile of impurity, on the other hand, the impurity cannot be highly activated, and the resistances Rext, Rdp and Rco increase. Thus, it is difficult to decrease all of the resistances Rext, Rdp, Rco and Rov and, hence, it is difficult to decrease parasitic resistance in the source/drain to a sufficient degree. Thus, there exists a difficulty in realizing a fine CMOS transistor of high performance having a gate length of not longer than 30 nm.

SUMMARY OF THE INVENTION

It is therefore an object of the present invention to provide a method of manufacturing a semiconductor device capable of forming a MOS transistor of high performance.

The above object is accomplished by a method of manufacturing a semiconductor device comprising the steps of:
forming a gate electrode on a semiconductor substrate via a gate-insulating film;
introducing a first impurity into the semiconductor substrate using the gate electrode as a mask;
introducing a diffusion-controlling substance into the semiconductor substrate to control a diffusion of the first impurity;
forming a side wall-insulating film on each side surface of the gate electrode;
introducing a second impurity of the same conductivity type as the first impurity into the semiconductor substrate deeper than an introduced portion of the first impurity using the gate electrode and the side wall-insulating film as masks;
activating the first and second impurities by a first annealing treatment; and
further activating the first and/or second impurities by a second annealing treatment of an annealing time of not longer than 100 milliseconds.

The above object is further accomplished by a method of manufacturing a semiconductor device comprising the steps of:
forming a gate electrode on a semiconductor substrate via a gate-insulating film;
introducing a first impurity into the semiconductor substrate using the gate electrode as a mask;
activating the first impurity by a first annealing treatment of an annealing time of not longer than 100 milliseconds;
forming a side wall-insulating film on each side surface of the gate electrode;
introducing a second impurity of the same conductivity type as the first impurity into the semiconductor substrate deeper than an introduced portion of the first impurity using the gate electrode and the side wall-insulating film as masks; and
further activating the first impurity while activating the second impurity by a second annealing treatment.

In the method of manufacturing the semiconductor device of the invention, further, a third annealing treatment of an annealing time of not longer than 100 milliseconds is effected after the second annealing treatment.

The present invention makes it possible to produce a semiconductor device having a MOS transistor of high performance.

BRIEF DESCRIPTION OF THE DRAWINGS

FIGS. 11A and 11B are graphs illustrating sheet resistances Rs of extension regions of MOS transistors;

DESCRIPTION OF THE PREFERRED EMBODIMENTS

[Preparatory Description of the Invention]

Figure 27:
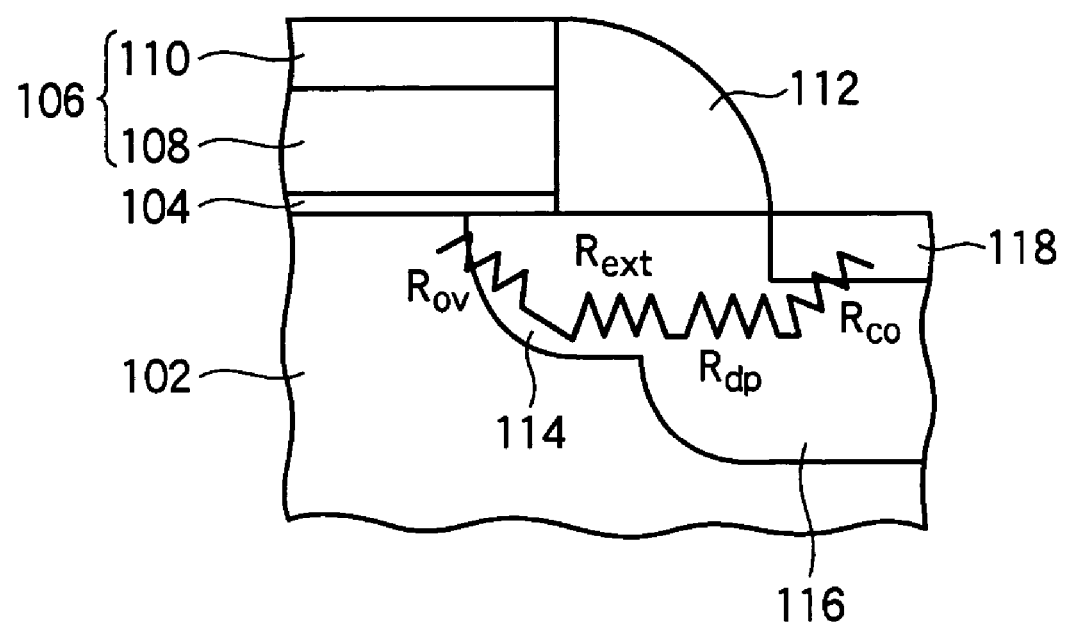
FIG. 27 is a diagram illustrating a partial sectional structure of a MOSFET.

FIG. 27 illustrates a partial sectional structure of a MOSFET (MOS field-effect transistor) having a general extension structure on the source side (or drain side). Referring to FIG. 27, on a semiconductor substrate 102, there is formed, via a gate-insulating film 104, a gate electrode 106 which is a laminate of a polysilicon film 108 and a silicide film 110 laminated in this order. A side wall-insulating film 112 is formed on each side surface of the gate electrode 106 and of the gate-insulating film 104. In the semiconductor substrate 102, there is formed a source/drain diffusion layer having a source/drain extension region 114 forming a shallow junction by shallowly introducing impurity of a low concentration, and a deep source/drain region 116 by deeply introducing impurity of a high concentration. The extension region 114 is formed for suppressing the short channel effect, and the deep source/drain region 116 is formed for decreasing the source/drain parasitic resistance. A silicide film 118 comprising, for example a cobalt silicide or a nickel silicide is formed on the source/drain diffusion layer.

Figure 28:
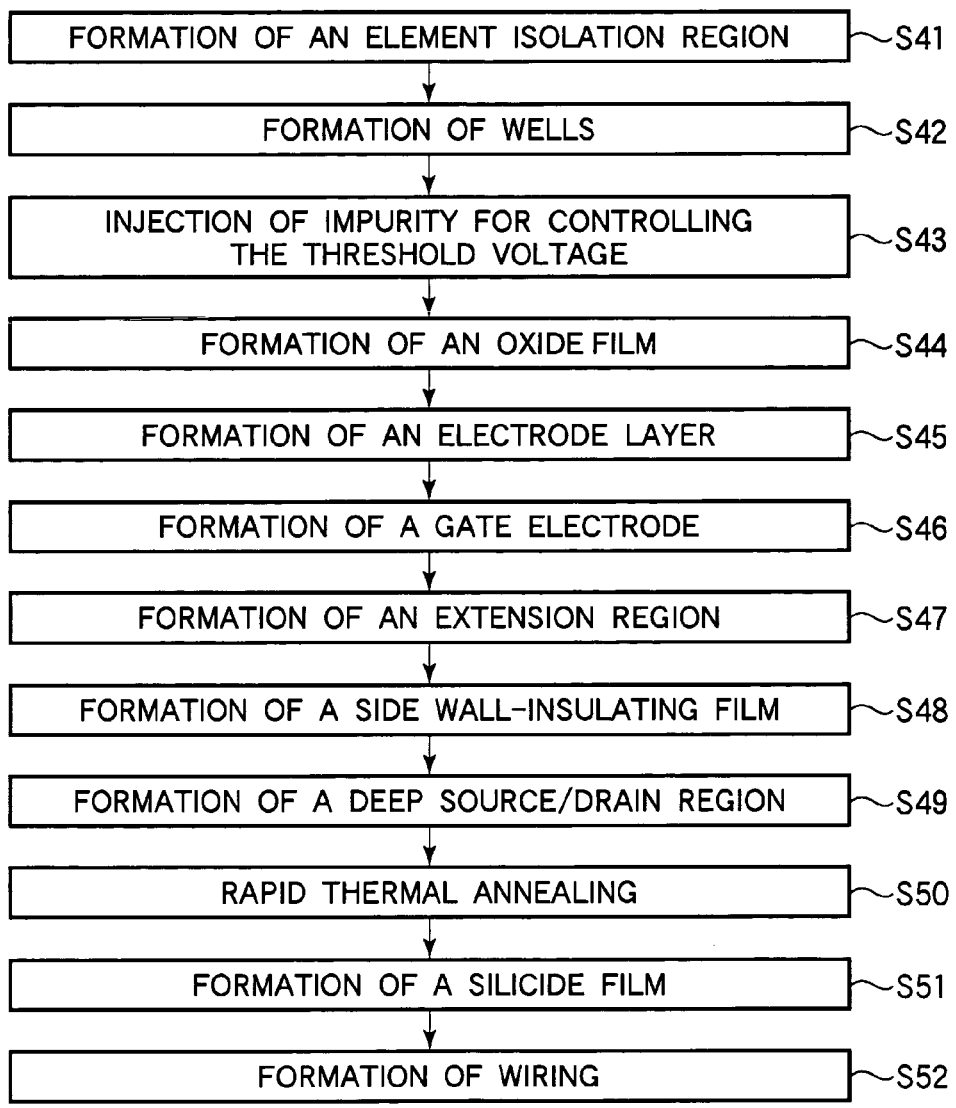
FIG. 28 is a flowchart illustrating a method of manufacturing a semiconductor device.

FIG. 28 is a flowchart illustrating a method of manufacturing a semiconductor device having a CMOS (complementary MOS) transistor. Referring to FIG. 28, a device isolation region is, first, formed on the semiconductor substrate 102 by using an STI (shallow trench isolation) method, and a p-type device forming region and an n-type device forming region are sectionalized (step S41). Next, n-type impurity ions are injected into the p-type device forming region to form an n-well therein and p-type impurity ions are injected into the n-type device forming region to form a p-well therein (step S42). Next, impurity ions are injected into the n-well and the p-well to control the threshold voltage of the transistor that is to be formed (step S43). Next, an oxide film is formed on the whole surface of the semiconductor substrate (step S44). Next, an electrode layer is formed on the whole surface of the oxide film (step S45). Thereafter, the electrode layer and the oxide film are patterned to form a gate electrode 106 and a gate-insulating film 104 (step S46).

Next, by using the gate electrode 106 as a mask, p-type impurity ions are shallowly injected into the p-type device forming region to form an extension region 114 (step S47). Thereafter, by using the gate electrode 106 as a mask, n-type impurity ions are shallowly injected into the n-type device forming region to form the extension region 114 (step S47). Next, the side wall-insulating film 112 is formed on each side surface of the gate electrode 106 (step S48). By using the gate electrode 106 and the side wall-insulating film 112 as masks, p-type impurity ions are deeply injected into the p-type device forming region to form a deep source/drain region 116 (step S49). Thereafter, by using the gate electrode 106 and the side wall-insulating film 112 as masks, n-type impurity ions are deeply injected into the n-type device forming region to form the deep source/drain region 116 (step S49). Thus, there is formed the source/drain diffusion layer having the extension region 114 and the deep source/drain region 116.

Next, the annealing treatment (heat treatment) is effected by using a rapid thermal annealing (spike RTA) system to activate the injected impurity (step 50). Next, silicide films 110 and 118 are formed on the upper layer of the gate electrode 106 and on the source/drain diffusion layer, respectively (step S51). Thereafter, a predetermined wiring structure is formed (step S52). Through the above steps, there is fabricated a semiconductor device having a CMOS transistor.

The resistances Rext, Rdp and Rco decrease with an increase in the activation of impurity if the junction depth is the same. To decrease the resistance Rov, on the other hand, the concentration profile of impurity in the transverse direction (right-and-left direction in FIG. 27) must be very steep. For example, the concentration gradient must be such that the impurity concentration decreases from about $1 \times 10^{19}$ cm$^{-3}$ down to about $1 \times 10^{18}$ cm$^{-3}$ within 3 nm from the extension region 114 in the channel direction.

First Embodiment

A method of manufacturing a semiconductor device according to a first embodiment of the invention will now be described with reference to FIGS. 1 to 16B. First, described below is a principle of the method of manufacturing the semiconductor device according to the embodiment. The embodiment has a first feature which resides in effecting a first annealing treatment by using a rapid thermal annealing system and a second annealing treatment of an annealing time of not longer than 100 milliseconds by using an LSA (laser spike annealing) system or an FLA (flash lamp annealing) system after the first annealing treatment. The embodiment further has a second feature which resides in the introduction of a diffusion-controlling substance into the source/drain diffusion layer for controlling the diffusion of impurity in the extension region. Namely, the embodiment has a feature in the combination of the above first feature and the second feature.

Figure 1:
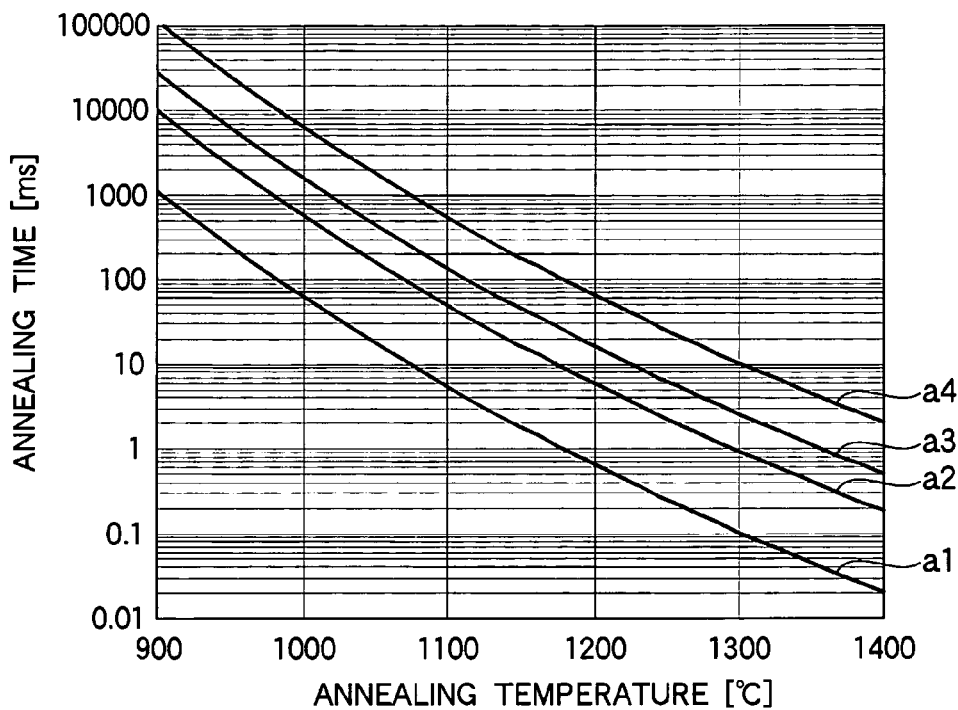
FIG. 1 is a graph illustrating relationships among the annealing temperature, the annealing time and the diffusion length of impurity in the annealing treatment.

First, described below is the first feature of the embodiment. FIG. 1 is a graph illustrating relationships among the annealing temperature, the annealing time and the diffusion length of a dopant (boron) in the annealing treatment, wherein the abscissa represents the annealing temperature (° C.) and the ordinate represents the annealing time (milliseconds). Curves a1, a2, a3 and a4 represent relationships between the annealing temperature and the annealing time of when the diffusion lengths of boron are 1 nm, 3 nm, 5 nm and 10 nm, respectively. It will be learned from FIG. 1, that the diffusion length of impurity increases with an increase in the annealing temperature or in the annealing time in the annealing treatment. When, for example, the diffusion length is allowed up to 3 nm (curve a2), the annealing time must be suppressed to be not longer than about 1 milliseconds if the heating is to be effected at 1300° C. highly activate the impurity.

Figure 2:
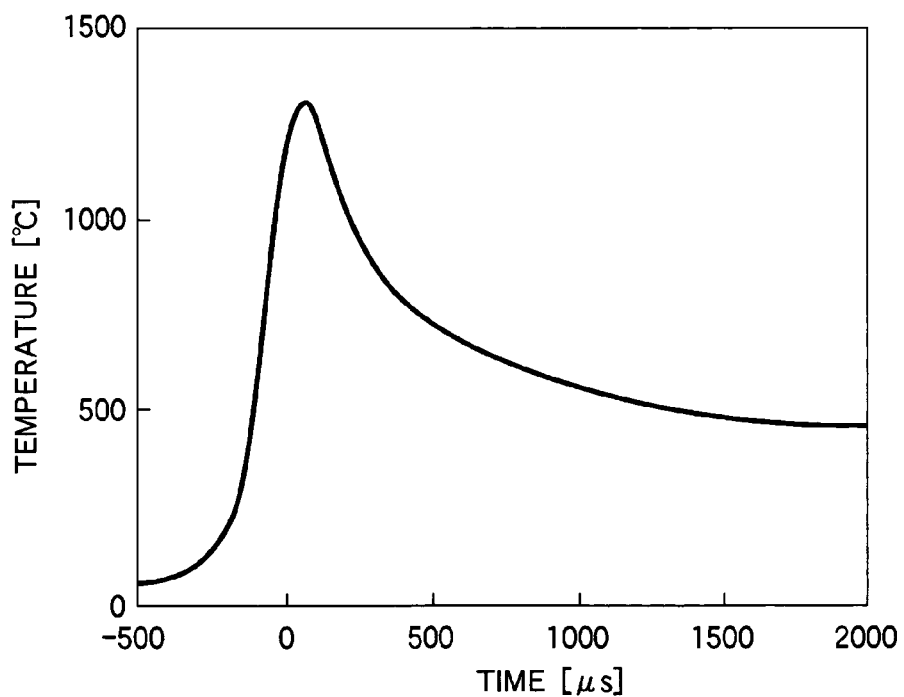
FIG. 2 is a graph showing a time-temperature profile of when an LSA system is used.
Figure 3A:
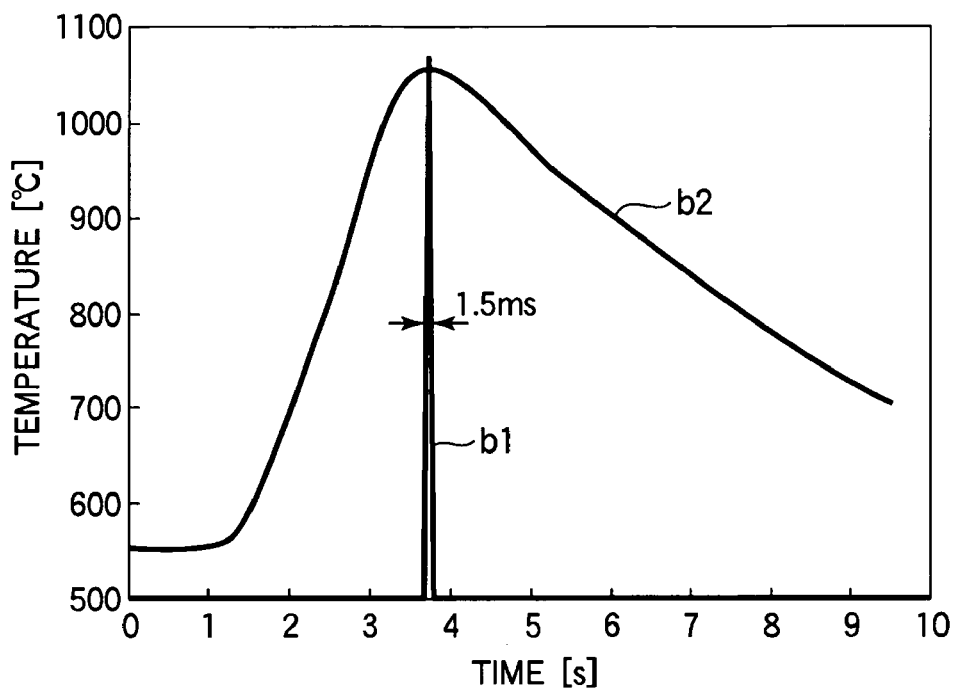
FIGS. 3A and 3B are graphs showing time-temperature profiles of when an FLA system and a rapid thermal annealing system are used.
Figure 3B:
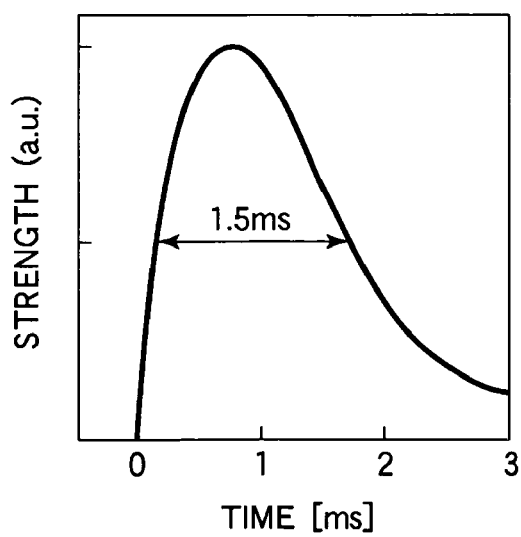

FIG. 2 is a graph showing a representative time-temperature profile of when an LSA system is used (see non-patent documents 1 and 2). In this graph, the abscissa represents the time (μs) and the ordinate represents the temperature (° C.). FIG. 3A is a graph showing a representative time-temperature profile (curve b1) of when an FLA system is used and a time-temperature profile (curve b2) of when a rapid thermal annealing system is used (see non-patent document 3). In this graph, the abscissa represents the time (seconds) and the ordinate represents the temperature (° C.). FIG. 3B is a graph showing a time-intensity profile of when the FLA system is used. In this graph, the abscissa represents the time (milliseconds) and the ordinate represents the irradiation intensity (a.u.; arbitrary unit). The curve b2 in FIG. 3A tells that the annealing treatment is conducted in a unit of seconds when the rapid thermal annealing system is used, while FIG. 2, the curve b1 of FIG. 3A and FIG. 3B tell that the annealing treatment is conducted in a unit of microseconds or in a unit of milliseconds when the LSA system and the FLA system are used. In this embodiment, the annealing treatment is effected by using the rapid thermal annealing system and, thereafter, the annealing treatment of an annealing time of not longer than 100 milliseconds is further effected by using the LSA system or the FLA system to further activate the impurity while suppressing the diffusion thereof. In this specification, the annealing treatment of an annealing time of not longer than 100 milliseconds is referred to as "millisecond annealing". The first feature of this embodiment makes it possible to decrease chiefly the resistances Rext, Rdp and Rco among the source/drain parasitic resistances.

Figure 4:
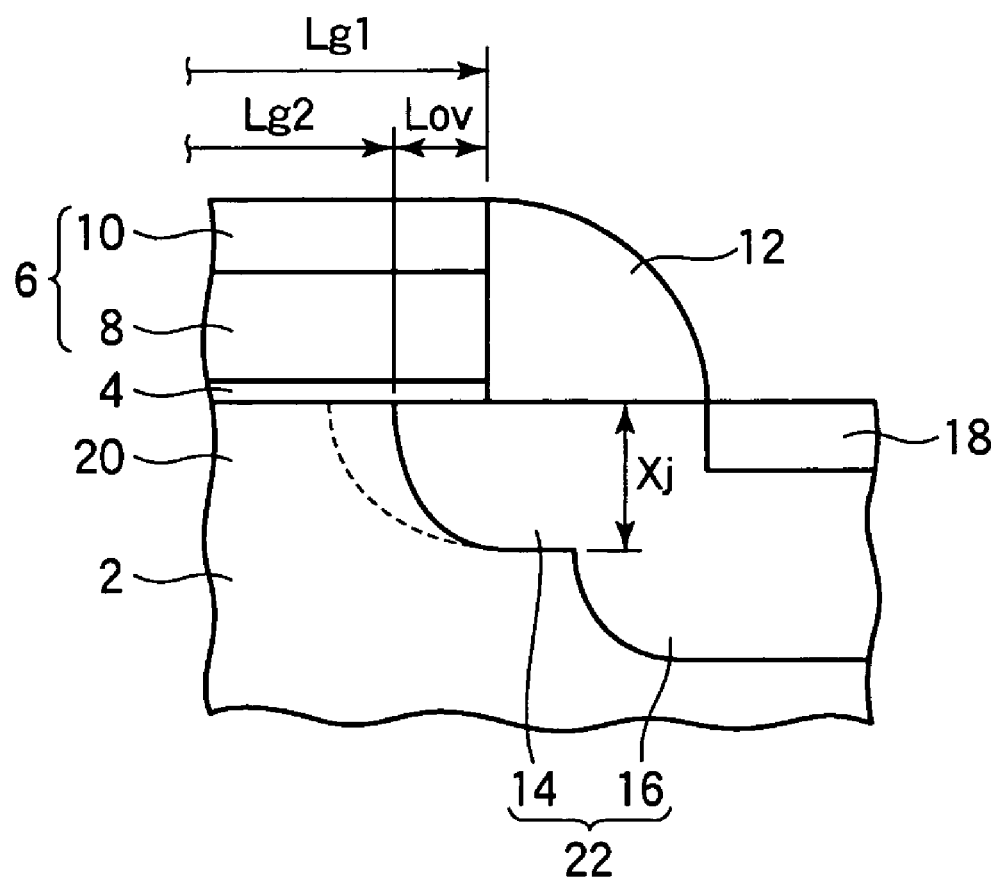
FIG. 4 is a diagram schematically illustrating a partial sectional structure of a MOSFET.

Next, described below is the second feature of this embodiment of introducing the diffusion-controlling substance into the source/drain diffusion layer. FIG. 4 schematically illustrates a partial sectional structure of a MOSFET of an extension structure on the source side (or the drain side). Referring to FIG. 4, on a semiconductor substrate 2, there is formed, via a gate-insulating film 4, a gate electrode 6 which is a laminate of a polysilicon film 8 and a silicide film 10 of, for example, a cobalt silicide or a nickel silicide laminated in this order. A side wall-insulating film 12 is formed on each side surface of the gate electrode 6 and of the gate-insulating film 4. In the semiconductor substrate 2, a region just under the gate electrode 6 is a channel region 20. In the semiconductor substrate 2, further, there is formed a source/drain diffusion layer 22 having a source/drain extension region 14 formed by shallowly introducing impurity of a low concentration, and a deep source/drain region 16 formed by deeply introducing impurity of a high concentration. A silicide film 18 comprising, for example a cobalt silicide or a nickel silicide is formed on the source/drain diffusion layer 22.

In order to improve the roll-off characteristics of threshold voltage of MOSFET, it is desired to maintain a metallurgically effective gate length Lg2 as long as possible with respect to a given physical gate length Lg1. Here, if the effective gate length Lg2 is constant, the physical gate length Lg1 can be shortened provided the overlapping length Lov between the gate electrode 6 and the end portion of the extension region 14 is shortened. On the other hand, however, the overlapping amount between the extension region 14 and the gate electrode 6 must be maintained to a sufficient degree.

A carrier density reaches about $10^{19}$ cm$^{-3}$ in the inverted layer in a strongly inverted state. Therefore, the extension region 14 just under the edge of the gate electrode 6, i.e., an end of the extension region 14 works as an electric resistance which may deteriorate the current driving ability. To suppress the decrease in the current driving ability, the impurity concentration must be set to be at least not lower than $5 \times 10^{19}$ cm$^{-3}$ at the end of the extension region 14.

To form the extension region 14 controlling the impurity concentration as described above, the concentration profile must be steep in the extension region 14 in the transverse direction (right-and-left direction in the drawing). Namely, it is desired to maintain an impurity concentration of not lower than $5 \times 10^{19}$ cm$^{-3}$ in the end portion to form a concentration profile in which the impurity concentration sharply decreases from the end toward the channel region 20. Ideally, it is desired to form the extension region 14 of a so-called box shape. Generally, however, the concentration profile of impurity in the transverse direction is dominated by the diffusion phenomenon making it very difficult to obtain a steep concentration profile.

The patent document 1 discloses a technology for forming a steep concentration profile in the extension region 14 in the transverse direction by using a diffusion-controlling substance such as nitrogen or fluorine for controlling the diffusion of impurity. This technology is to steepen the concentration profile of impurity in the transverse direction by suppressing the diffusion of impurity in the transverse direction by adding the diffusion-controlling substance in the annealing treatment by using the rapid thermal annealing system. In this embodiment, likewise, the diffusion-controlling substance is introduced into the source/drain diffusion layer 22 to control the diffusion of impurity in the extension region 14 and to steepen the concentration profile in the transverse direction. In FIG. 4, a solid line represents the boundary between the extension region 14 and the channel region 20 of when the diffusion of impurity is controlled by introducing the diffusion-controlling substrate, and a broken line represents the boundary between the extension region 14 and the channel region 20 of when no diffusion-controlling substance is introduced. The controlled diffusion of impurity makes it possible to shorten the overlapping length Lov and, hence, to shorten the physical gate length Lg1 yet maintaining the effective gate length Lg2 as long as possible. The second feature of this embodiment makes it possible to decrease chiefly the resistance Rov among the source/drain parasitic resistances.

According to the embodiment combining the first and the second features as described above, the resistances Rext, Rdp, Rco and Rov can all be decreased and, hence, the source/drain parasitic resistances can be decreased to a sufficient degree. It is therefore made possible to realize even a fine CMOS transistor having a short gate length Lg1 featuring stable operation and high performance.

Figure 5:
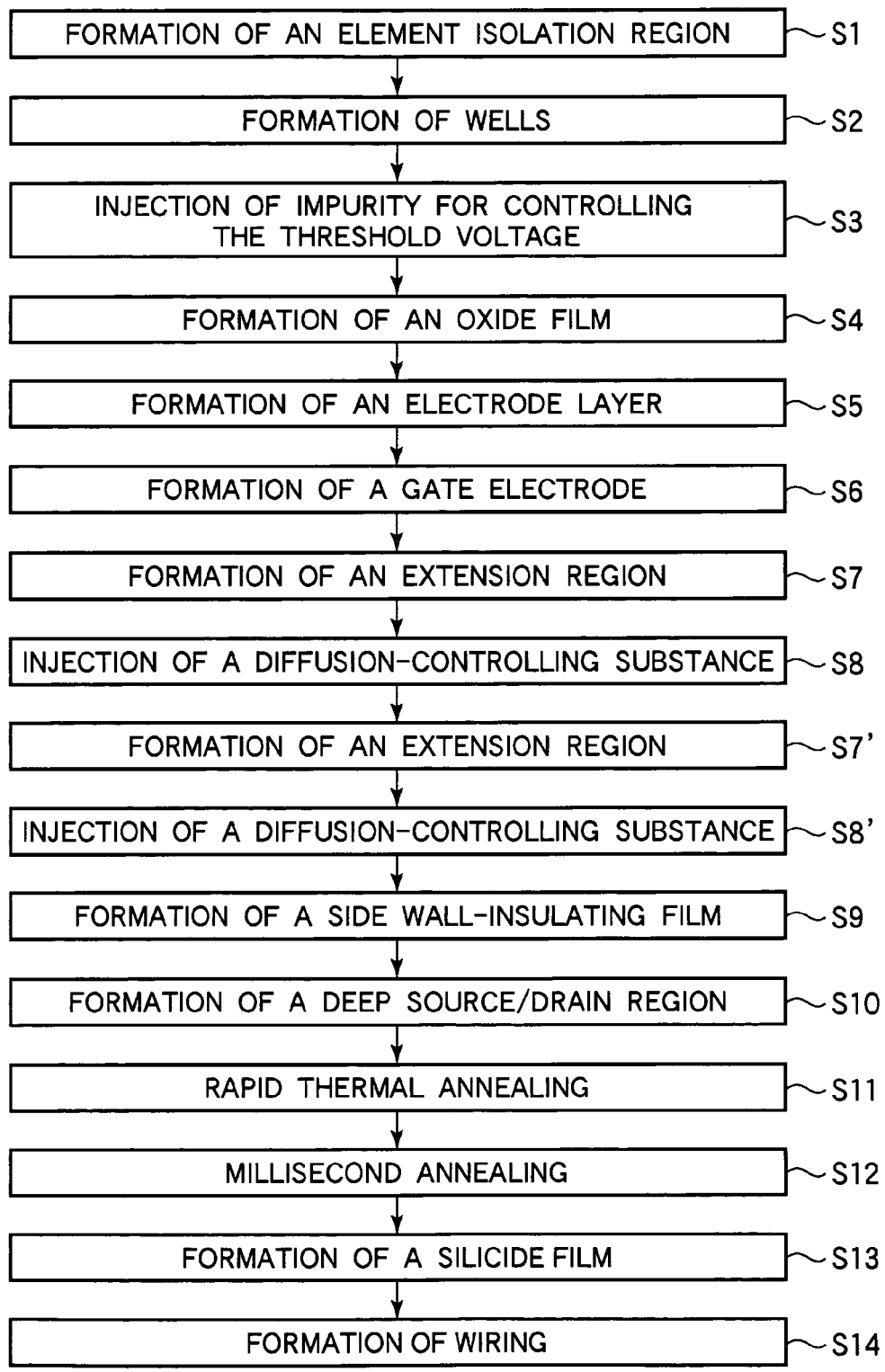
FIG. 5 is a flowchart illustrating a method of manufacturing a semiconductor device according to a first embodiment of the invention.
Figure 6A:
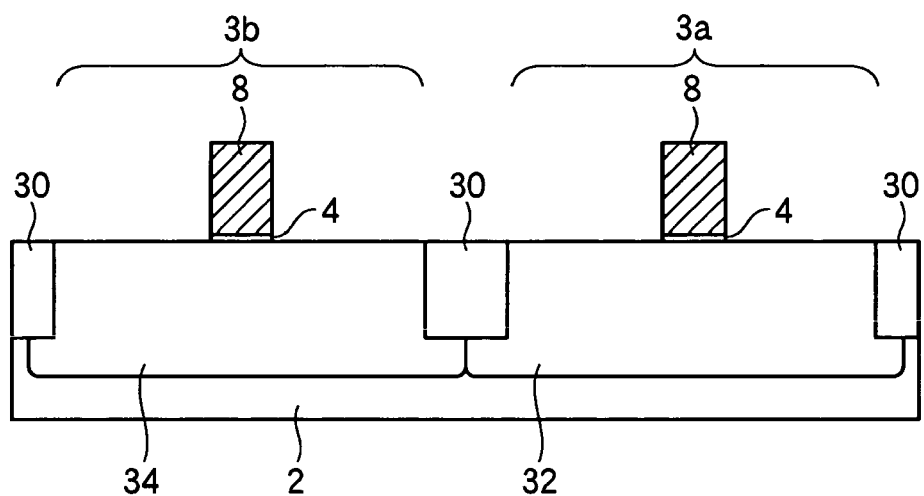
FIGS. 6A and 6B are sectional views illustrating the steps of the method of manufacturing the semiconductor device according to the first embodiment of the invention.

FIG. 5 is a flowchart illustrating a method of manufacturing a semiconductor device according to an embodiment of the invention. FIGS. 6A to 10B are sectional views illustrating the steps of the method of manufacturing the semiconductor device according to the embodiment. As shown in FIGS. 5 and 6A, first, a device isolation region 30 is formed in the semiconductor substrate 2 by using an STI method, and a p-type device forming region 3a and an n-type device forming region 3b are sectionalized (step S1 in FIG. 5, hereinafter the same). Next, a resist layer (not shown) is formed to cover, for example, the n-type device forming region 3b. Thereafter, n-type impurity ions are injected into the p-type device forming region using the resist layer as a mask to form an n-well 32 therein (step S2) followed by the removal of the resist layer covering the n-type device forming region 3b. Next, a resist layer (not shown) is formed to cover the p-type device forming region 3a. By using the above resist layer as a mask, p-type impurity ions are injected into the n-type device forming region 3b to form a p-well 34 therein (step S2) followed by the removal of the resist layer covering the p-type device forming region 3a. Next, impurity ions are injected into the n-well 32 and the p-well 34 at predetermined concentrations to highly precisely control the threshold voltage of the transistor that is to be formed (step S3). Next, an oxide film is formed on the whole surface of the semiconductor substrate 2 relying upon the heat-oxidation method (step S4). Next, a polysilicon film is formed relying upon, for example, a CVD method and an electrode layer is formed on the whole surface of the oxide film (step S5). Thereafter, the electrode layer and the oxide film are patterned to form a polysilicon film 8 (hereinafter often called gate electrode 8) that subsequently becomes a major portion of the gate electrode 6 and a gate-insulating film 4 on both the p-type device forming region 3a and the n-type device forming region 3b (step S6).

Figure 6B:
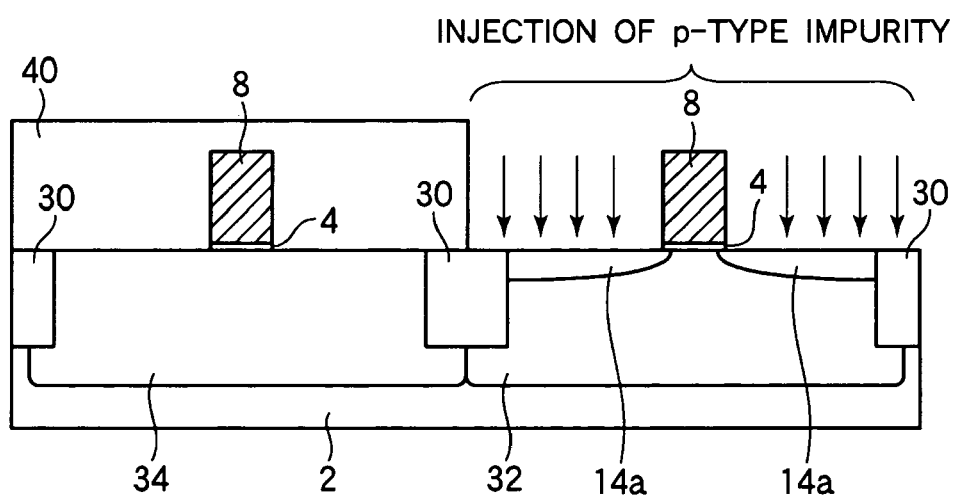

Next, as shown in FIG. 6B, a resist layer 40 is formed to cover, for example, the n-type device forming region 3b. Thereafter, by using the resist layer 40 and the gate electrode 8 as masks, a diffusion-controlling substance such as fluorine (F) or germanium (Ge) and p-type impurity such as boron (B) are introduced into the p-type device forming region 3a relying upon, for example, an ion injection method. The conditions for injecting F are, for example, an acceleration energy of 2 keV and a dosage of $1.00 \times 10^{15}$ cm$^{-2}$, and the conditions for injecting Ge are, for example, an acceleration energy of 2 keV and a dosage of $1.00 \times 10^{15}$ cm$^{-2}$. Further, the conditions for injecting B are an acceleration energy of 0.1 keV to 1 keV and a dosage of $1.00 \times 10^{14}$ cm$^{-2}$ to $1.00 \times 10^{16}$ cm$^{-2}$, such as the acceleration energy of 0.3 keV and a dosage of $1.50 \times 10^{15}$ cm$^{-2}$. Thus, there is formed a region (extension-forming region) 14a that becomes the extension region of the p-type device forming region 3a (step S7).

Figure 7A:
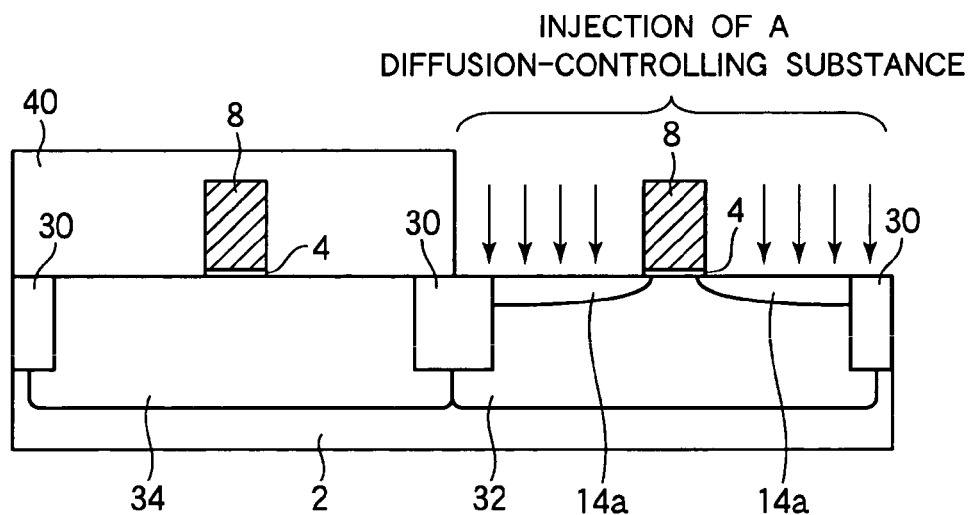
FIGS. 7A and 7B are sectional views illustrating the steps of the method of manufacturing the semiconductor device according to the first embodiment of the invention.

Next, as shown in FIG. 7A, the diffusion-controlling substance is introduced into the p-type device forming region 3a relying upon, for example, the ion injection method by using the resist layer 40 and the gate electrode 8 as masks (step S8). As the diffusion-controlling substance, there can be used any one of nitrogen (N), Ge, F or carbon (C) or a combination thereof. The conditions for injecting the diffusion-controlling substance are, for example, an acceleration energy of 0.5 keV to 20 keV, and a dosage of $1.00 \times 10^{14}$ cm$^{-2}$ to $1.00 \times 10^{16}$ cm$^{-2}$. Thereafter, the resist layer 40 covering the n-type device forming region 3b is removed.

Figure 7B:
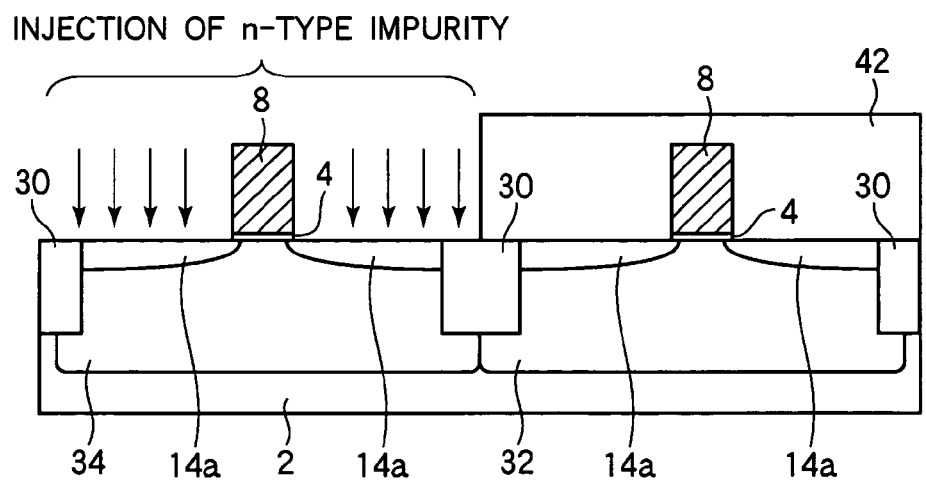

Referring next to FIG. 7B, a resist layer 42 is formed to cover the p-type device forming region 3a. Thereafter, by using the resist layer 42 and the gate electrode 8 as masks, n-type impurities such as arsenic (As) are introduced into the n-type device forming region 3b relying upon, for example, the ion injection method. The conditions for injecting As are, for example, an acceleration energy of 0.1 keV to 5 keV and a dosage of $1.00 \times 10^{14}$ cm$^{-2}$ to $1.00 \times 10^{16}$ cm$^{-2}$ and, for example, an acceleration energy of 1.0 keV and a dosage of $1.50 \times 10^{15}$ cm$^{-2}$. Thus, there is formed a region (extension-forming region) 14a that becomes the extension region of the n-type device forming region 3b (step S7').

Figure 8A:
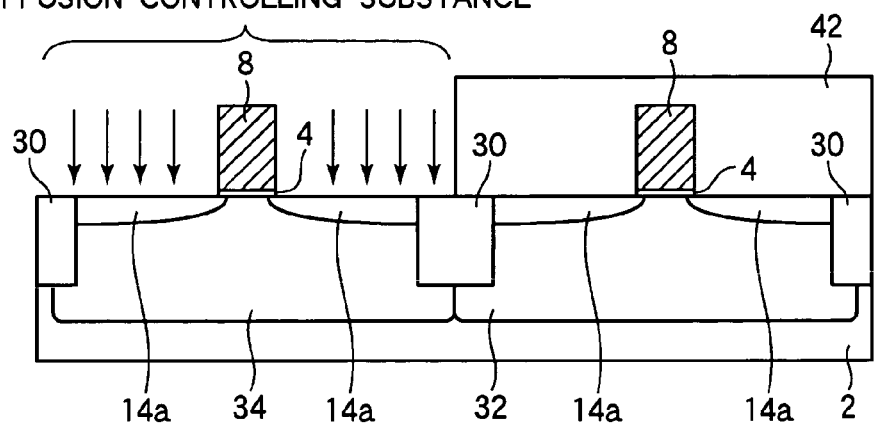
FIGS. 8A and 8B are sectional views illustrating the steps of the method of manufacturing the semiconductor device according to the first embodiment of the invention.

Next, as shown in FIG. 8A, the diffusion-controlling substance is introduced into the n-type device forming region 3b relying upon, for example, the ion injection method by using the resist layer 42 and the gate electrode 8 as masks (step S8'). As the diffusion-controlling substance, there can be used any one of N, Ge, F or C or a combination thereof. The conditions for injecting the diffusion-controlling substance are, for example, an acceleration energy of 0.5 keV to 20 keV, and a dosage of $1.00 \times 10^{14}$ cm$^{-2}$ to $1.00 \times 10^{16}$ cm$^{-2}$. The typical conditions for injecting F are the acceleration energy of 7 keV and the dosage of $5.00 \times 10^{14}$ cm$^{-2}$. Thereafter, the resist layer 42 covering the p-type device forming region 3a is removed.

In this embodiment, after injecting an impurity of predetermined conductivity type into the p-type device forming region 3a and into the n-type device forming region 3b, the diffusion-controlling substances are injected thereto. However, the diffusion-controlling substances may be injected prior to injecting the impurity of predetermined conductivity type. In this embodiment, further, the diffusion-controlling substances are injected into the p-type device forming regions 3a and into the n-type device forming regions 3b through separate steps (steps S8, S8'). However, the diffusion-controlling substances may be injected into the whole surfaces of the p-type device forming region 3a and the n-type device forming region 3b prior to forming the resist layer 40.

Figure 8B:
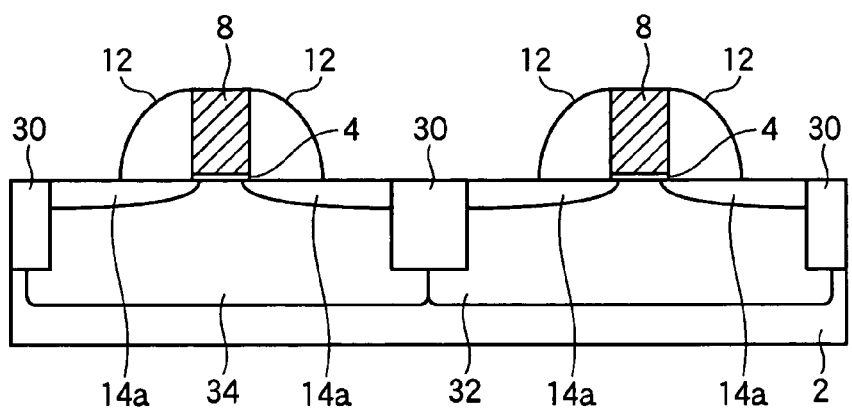

Next, a silicon oxide film (not shown) is formed on the whole surface of the substrate followed by anisotropic etching on the whole surface to remove the silicon oxide film from the regions except both side surfaces of the gate electrode 8 and of the gate-insulating film 4. As shown in FIG. 8B, therefore, a side wall-insulating film 12 is formed on each side surface of the gate electrode 8 and of the gate-insulating film 4 (step S9).

Figure 9A:
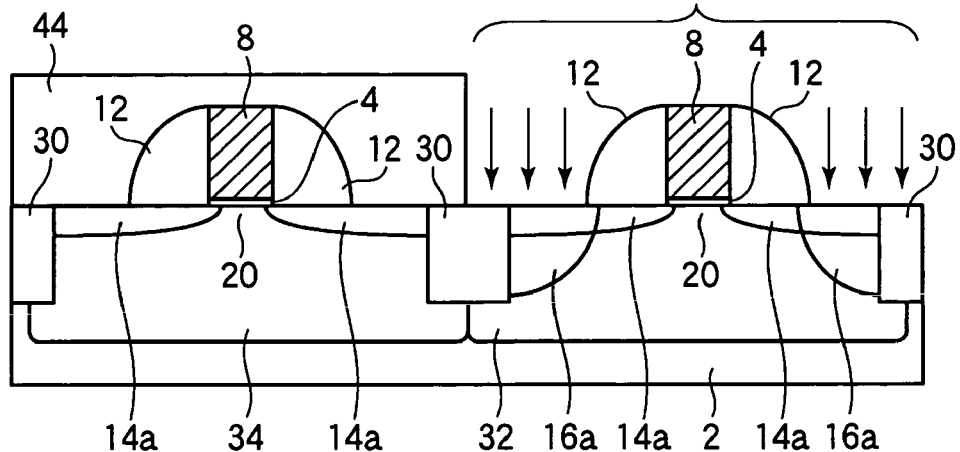
FIGS. 9A and 9B are sectional views illustrating the steps of the method of manufacturing the semiconductor device according to the first embodiment of the invention.

Referring next to FIG. 9A, a resist layer 44 is formed to cover, for example, the n-type device forming region 3b. Next, relying upon, for example, the ion injection method, p-type impurity such as B or In or a combination thereof is introduced into the p-type device forming region 3a by using the resist layer 44, gate electrode 8 and side wall-insulating films 12 as masks. The p-type impurity ions are injected with an acceleration energy and a dosage which are greater than those for the p-type impurity injected into the extension-forming region 14a of the p-type device forming region 3a. Thus, there is formed the deep source/drain-forming regions 16a into where the p-type impurity is deeply introduced (step S10). Thereafter, the resist layer 44 covering the n-type device forming region 3b is removed.

Figure 9B:
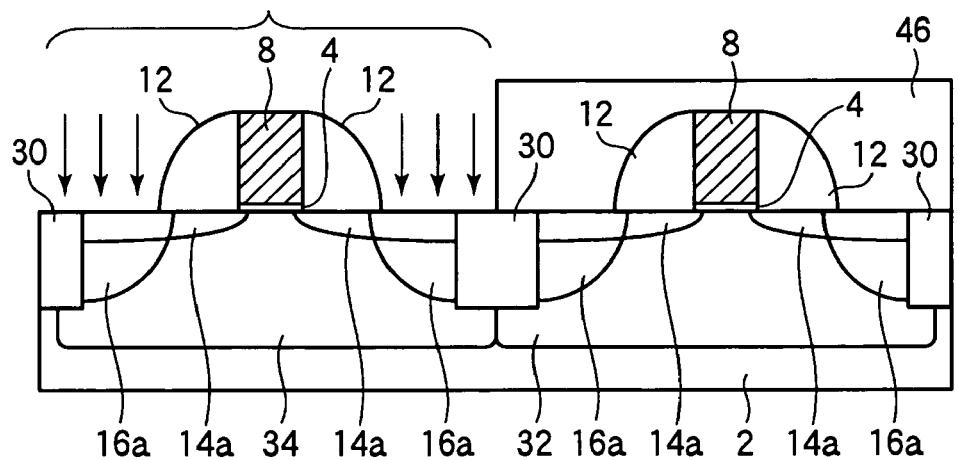

Referring next to FIG. 9B, a resist layer 46 is formed to cover the p-type device forming region 3a. Next, relying upon, for example, the ion injection method, n-type impurity such as As or phosphorus (P) or a combination thereof is introduced into the n-type device forming region 3b by using the resist layer 46, gate electrode 8 and side wall-insulating films 12 as masks. The n-type impurity ions are injected with an acceleration energy and a dosage which are greater than those for the n-type impurity injected into the extension-forming region 14a of the n-type device forming region 3b. Thus, there is formed the deep source/drain-forming regions 16a into where then-type impurity is deeply introduced (step S10). Thereafter, the resist layer 46 covering the p-type device forming region 3a is removed. Through these steps, the extension-forming regions 14a and the deep source/drain-forming regions 16a are formed in both the p-type device forming region 3a and the n-type device forming region 3b.

Figure 10A:
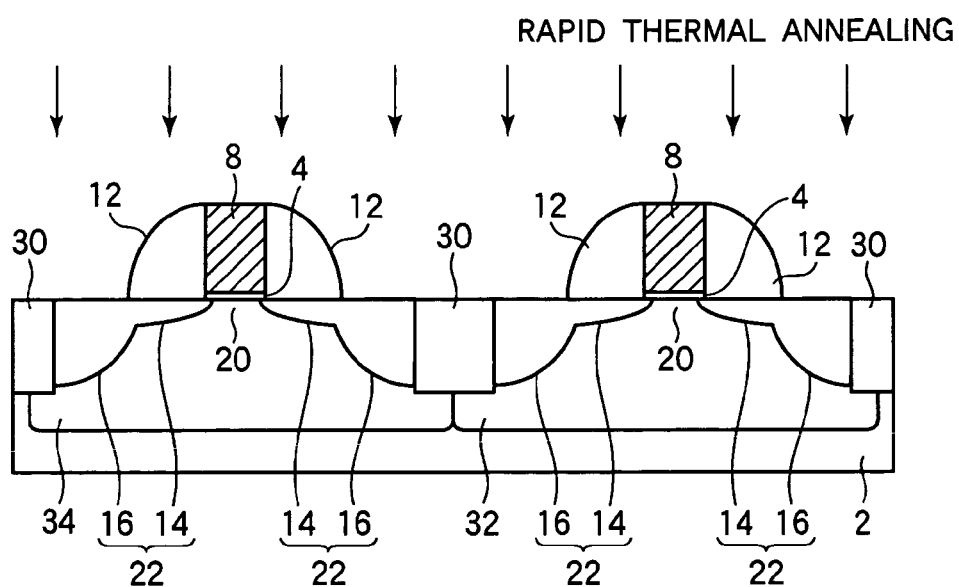
FIGS. 10A and 10B are sectional views illustrating the steps of the method of manufacturing the semiconductor device according to the first embodiment of the invention.

Referring next to FIG. 10A, the annealing treatment is effected by using the rapid thermal annealing system to diffuse and activate the injected impurity (step S11). The annealing treatment is effected at an annealing temperature (temperature that is reached) of not lower than 900° C. but not higher than 1100° C., and at an annealing time of not shorter than 0.1 seconds but not longer than 10 seconds.

Figure 10B:
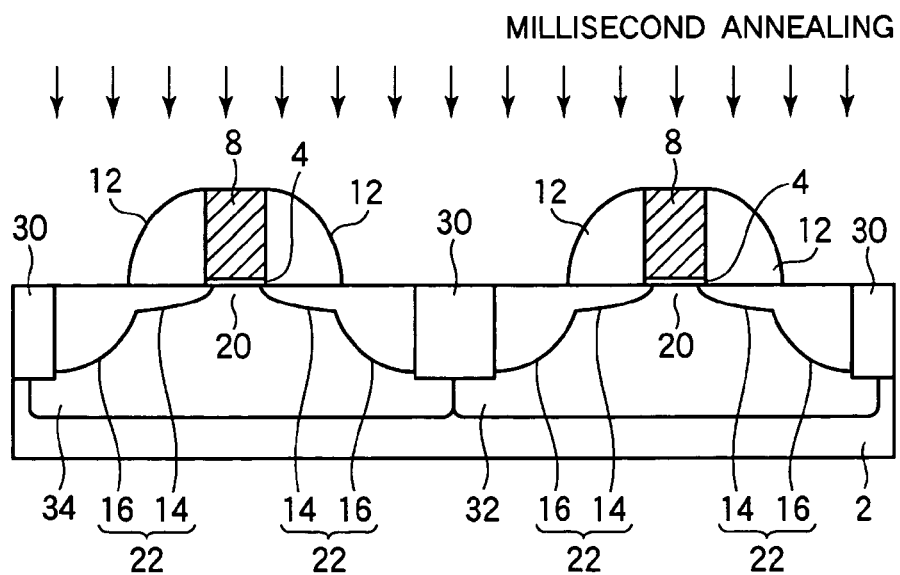

Referring next to FIG. 10B, the millisecond annealing treatment is effected by using the LSA system or the FLA system to further activate the impurity (step S12). The millisecond annealing treatment is effected at an annealing temperature of not lower than 1100° C. but not higher than 1400° C., and at an annealing time of not shorter than 0.01 milliseconds but not longer than 100 milliseconds. In particular, it is desired that the annealing time is not shorter than 0.1 milliseconds but not longer than 10 milliseconds. In this embodiment, the annealing temperature is set to be 1350° C. and the annealing time is set to be 0.2 milliseconds. The impurity is not almost diffused by the millisecond annealing treatment but are highly activated to a degree that could not be accomplished by the rapid thermal annealing method. Thus, there is formed a source/drain diffusion layer 22 having an extension region 14 and a deep source/drain region 16 in which the extension forming region 14a and the deep source/drain forming region 16a are activated in the p-type device forming region 3a and in the n-type device forming region 3b, and there is obtained a steep impurity concentration profile from the end of the extension region 14 to the channel region 20.

Next, a metal film such as of cobalt or nickel is formed on the whole surface of the substrate. Next, the semiconductor substrate 2 is heated to react the metal film, silicon film and silicon substrate on a region where they come in contact with each other. Thereafter, the metal film is removed from the unreacted portions. As shown in FIG. 4, therefore, the silicide films 10 and 18 are formed on the gate electrode 6 and on the source/drain diffusion layer 22, and the gate electrode 6 is formed having the polysilicon film 8 and the silicide film 10 laminated in this order (step S13). Thereafter, a predetermined wiring structure is formed by using an insulating film and a conducting film (step S14). A semiconductor device having a CMOS transistor is fabricated through the above steps.

FIG. 11A is a graph illustrating a sheet resistance Rs (Ω/sq.) of the extension region 14 of an nMOS transistor, and 11B is a graph illustrating a sheet resistance Rs (Ω/sq.) of the extension region 14 of a PMOS transistor. In FIGS. 11A and 11B, (1) and (3) represent sheet resistances Rs in the extension regions 14 of conventional MOS transistors in which the impurity is activated by the rapid thermal annealing only. In FIGS. 11A and 11B, (2) represents the sheet resistances Rs of the extension regions 14 of MOS transistors in which the impurity is activated by the rapid thermal annealing and the millisecond annealing treatment as described as the first feature of the embodiment. Here, however, the diffusion-controlling substance has not been introduced into the MOS transistors (1), (2) and (3) of FIGS. 11A and 11B. In FIGS. 11A and 11B, further, (1) and (2) represent sheet resistances Rs of the extension regions 14 into where the impurity is injected in a dosage of $1.0 \times 10^{15}$ cm$^{-2}$, and (3) represents the sheet resistances Rs of the extension regions 14 into where the impurity is injected in a dosage of $1.5 \times 10^{15}$ cm$^{-2}$ which is 1.5 times as great.

Referring to FIGS. 11A and 11B, if the dosage is the same, the sheet resistances Rs ((2) in FIGS. 11A and 11B) of the MOS transistors in which the impurity is activated by the rapid thermal annealing and by the millisecond annealing treatment are lower than the sheet resistances Rs ((1) in FIGS. 11A and 11B) of the MOS transistors in which the impurity is activated by the rapid thermal annealing only. The sheet resistances Rs of the MOS transistor in which the impurity is activated by the rapid thermal annealing and by the millisecond annealing treatment are nearly equal to the sheet resistances Rs ((3) in FIGS. 11A and 11B) of the MOS transistors in which the impurity injected in a dosage of 1.5 times as great is activated by the rapid thermal annealing only. This means that the impurity can be highly activated when the millisecond annealing treatment is effected and, hence, the junction depth Xj (see FIG. 4) can be decreased if the sheet resistance Rs is the same.

Figure 12:
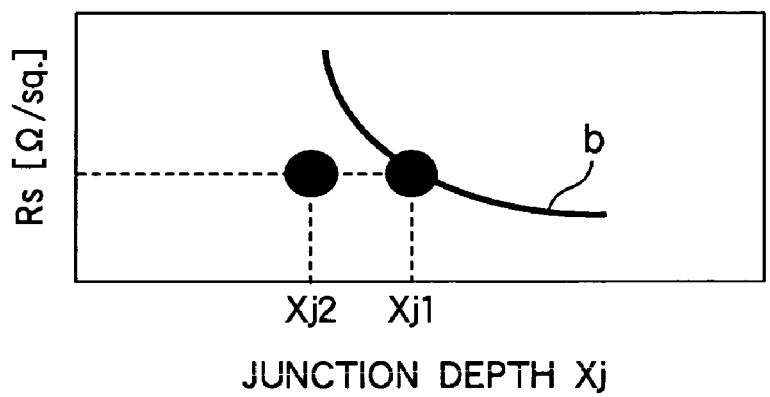
FIG. 12 is a graph schematically illustrating a relationship between the junction depth Xj and the sheet resistance Rs of a MOS transistor.

FIG. 12 is a graph schematically illustrating a relationship between the junction depth Xj and the sheet resistance Rs of the MOS transistor, wherein the abscissa represents the junction depth Xj and the ordinate represents the sheet resistance Rs. A curve b represents a relationship between the junction depth Xj and the sheet resistance Rs of when the impurity injected in a dosage of $1.5 \times 10^{15}$ cm$^{-2}$ is activated by the rapid thermal annealing only. When the impurity is activated by the rapid thermal annealing only as represented by the curve b in FIG. 12, the sheet resistance Rs increases with a decrease in the junction depth Xj. In this embodiment, on the other hand, a junction depth Xj2 shallower than the junction depth Xj1 is obtained maintaining the same sheet resistance Rs owing to the millisecond annealing treatment.

Figure 13:
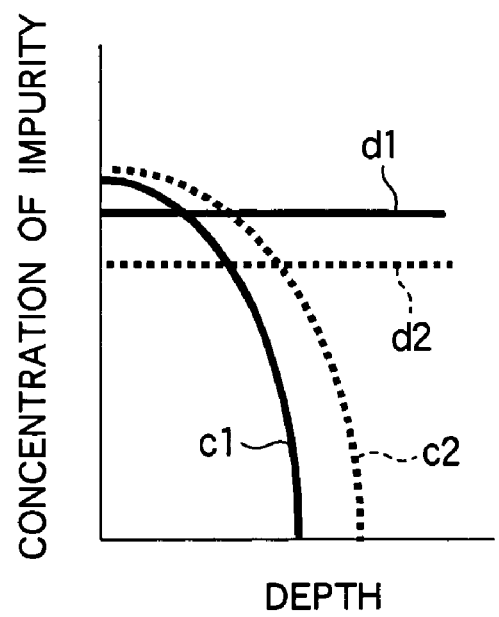
FIG. 13 is a graph schematically illustrating a relationship between the depth from the surface of the substrate of the MOS transistor and the impurity concentration thereof.

FIG. 13 is a graph schematically illustrating a relationship between the depth from the surface of the substrate of the MOS transistor and the impurity concentration thereof, wherein the abscissa represents the depth from the surface of the substrate and the ordinate represents the impurity concentration. A curve c1 represents a relationship between the depth from the surface of the substrate and the impurity concentration of when the impurity is injected in a dosage of $1.0 \times 10^{15}$ cm$^{-2}$, and a curve c2 represents a relationship between the depth from the surface of the substrate and the impurity concentration of when the impurity is injected in a dosage of $1.5 \times 10^{15}$ cm$^{-2}$. A straight line d1 represents an upper limit of activation of impurity by the millisecond annealing treatment, and a straight line d2 represents an upper limit of activation of impurity by the rapid thermal annealing method of which the annealing temperature is usually lower than that of the millisecond annealing treatment. The upper limit of activation increases due to the millisecond annealing treatment. When the dosage is the same (junction depth Xj, too, is the same), therefore, the resistance Rext can be decreased when the millisecond annealing treatment is effected as shown in FIG. 13. When the resistance Rext is the same, the junction depth Xj can be decreased upon effecting the millisecond annealing treatment.

Figure 14:
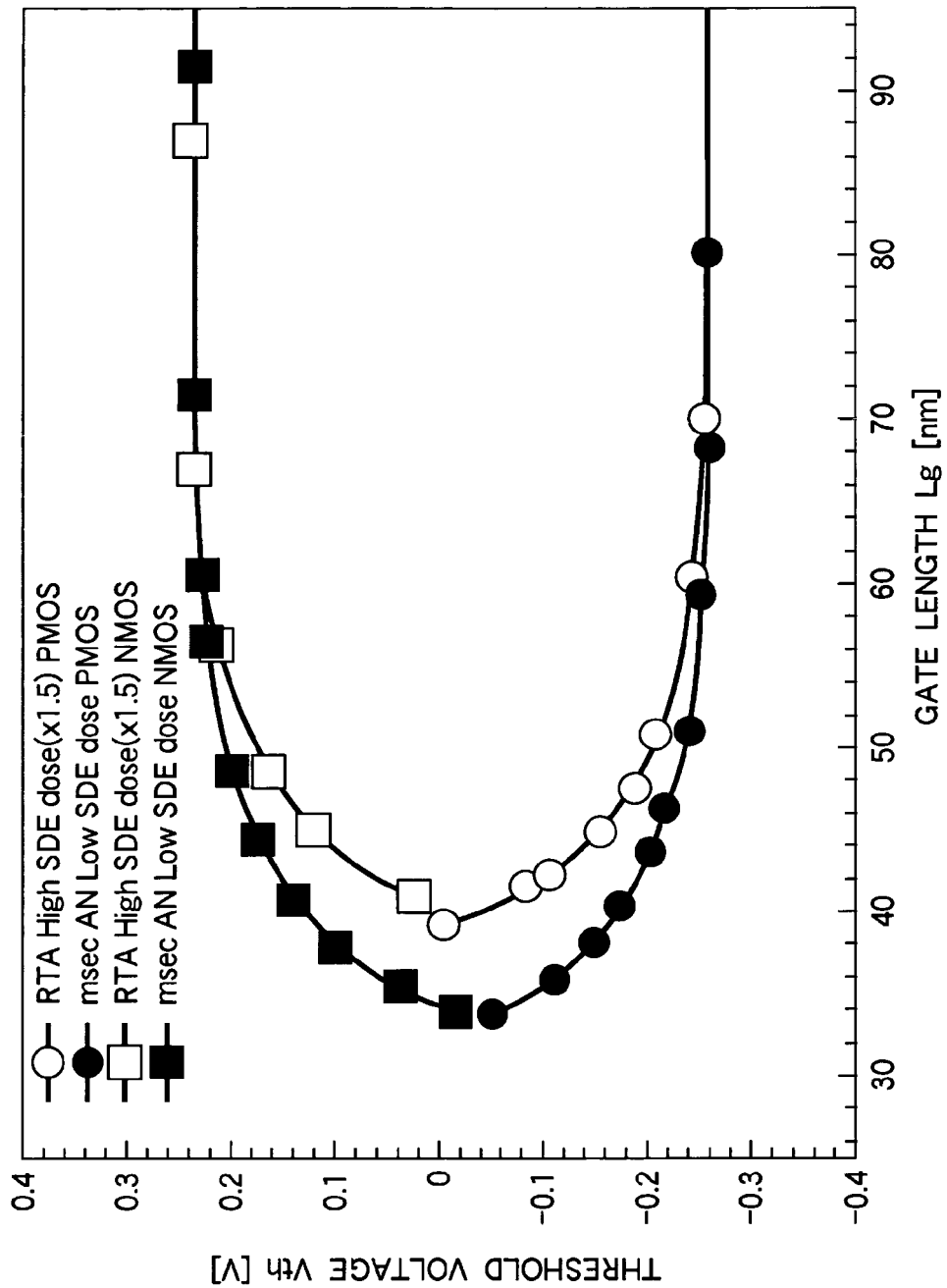
FIG. 14 is a graph illustrating a relationship between the gate length Lg of the MOS transistor and the threshold voltage Vth thereof.

FIG. 14 is a graph illustrating a relationship between the gate length Lg of the MOS transistor and the threshold voltage Vth thereof, wherein the abscissa represents the gate length Lg (nm) and the ordinate represents the threshold voltage Vth (V). In FIG. 14, black circles represent a relationship between the gate length Lg and the threshold voltage Vth of a pMOS transistor (in FIG. 11B) of when the impurity injected in a dosage of $1.0 \times 10^{15}$ cm$^{-2}$ are activated by the rapid thermal annealing and by the millisecond annealing treatment, and open circles represent a relationship between the gate length Lg and the threshold voltage Vth of a pMOS transistor ((3) in FIG. 11B) of when the impurity injected in a dosage of $1.5 \times 10^{15}$ cm$^{-2}$ is activated by the rapid thermal annealing only. Further, black squares represent a relationship between the gate length Lg and the threshold voltage Vth of an nMOS transistor ((2) in FIG. 11A) of when the impurity injected in a dosage of $1.0 \times 10^{15}$ cm$^{-2}$ is activated by the rapid thermal annealing and by the millisecond annealing treatment, and open squares represent a relationship between the gate length Lg and the threshold voltage Vth of an nMOS transistor ((3) in FIG. 11A) of when the impurity injected in a dosage of $1.5 \times 10^{15}$ cm$^{-2}$ is activated by the rapid thermal annealing only. It will be learned from FIG. 14 that the short channel effect can be suppressed when the millisecond annealing treatment is effected if the MOS transistors having nearly the same sheet resistance Rs are compared. This is because, if the sheet resistance Rs is the same, the dosage of impurity can be decreased by effecting the millisecond annealing treatment and, hence, the junction depth Xj can be decreased as described above and, besides, the overlapping length Lov of the extension region 14 can be decreased under the gate electrode 6.

Figure 15B:
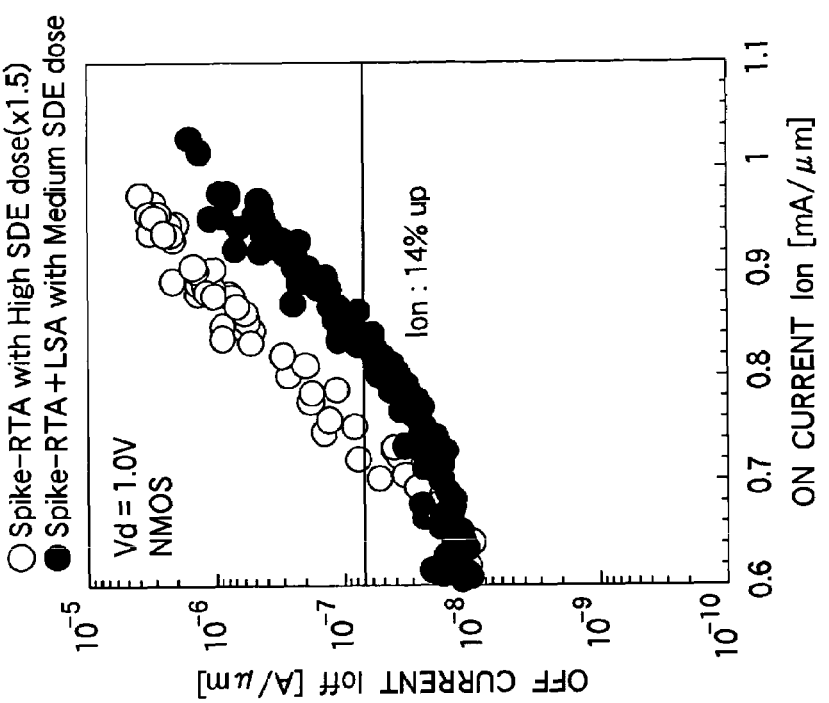
FIGS. 15A and 15B are graphs illustrating on current-off current characteristics of the MOS transistors.
Figure 15A:
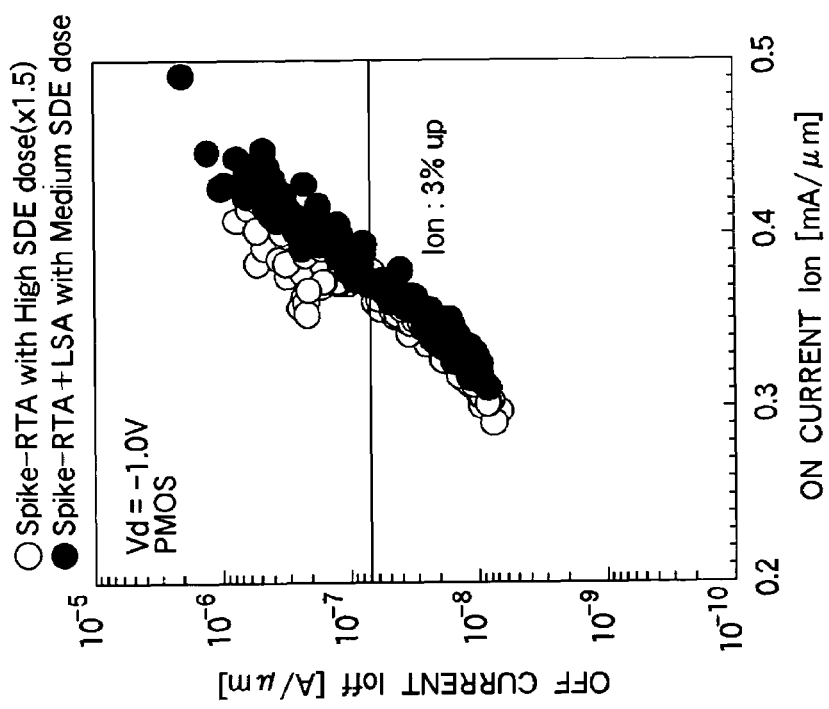

FIG. 15A is a graph illustrating on current-off current characteristics of a pMOS transistor and FIG. 15B is a graph illustrating on current-off current characteristics of an nMOS transistor, wherein the abscissa represents the on current Ion (mA/µm) and the ordinate represents the off current Ioff (A/µm) in logarithm. In FIG. 15A, black circles represent on current-off current characteristics of the PMOS transistor ((2) in FIG. 11B) of when the impurity injected in a dosage of $1.0 \times 10^{15}$ cm$^{-2}$ is activated by the rapid thermal annealing and the millisecond annealing treatment, and open circles represent on current-off current characteristics of the PMOS transistor ((3) in FIG. 11B) of when the impurity injected in a dosage of $1.5 \times 10^{15}$ cm$^{-2}$ is activated by the rapid thermal annealing only. In FIG. 15B, black circles represent on current-off current characteristics of the nMOS transistor ((2) in FIG. 11A) of when the impurity injected in a dosage of $1.0 \times 10^{15}$ cm$^{-2}$ is activated by the rapid thermal annealing and the millisecond annealing treatment, and open circles represent on current-off current characteristics of the nMOS transistor ((3) in FIG. 11A) of when the impurity injected in a dosage of $1.5 \times 10^{15}$ cm$^{-2}$ is activated by the rapid thermal annealing only. Here, the drain voltage Vd of the pMOS transistor is set to be −1.0 V and the drain voltage Vd of the nMOS transistor is set to be 1.0 V. As shown in FIGS. 15A and 15B, the on current-off current characteristics are improved by about 3% when the pMOS transistor is subjected to the millisecond annealing treatment while the on current-off current characteristics are improved by about 14% when the nMOS transistor is subjected to the millisecond annealing treatment.

Figure 16A:
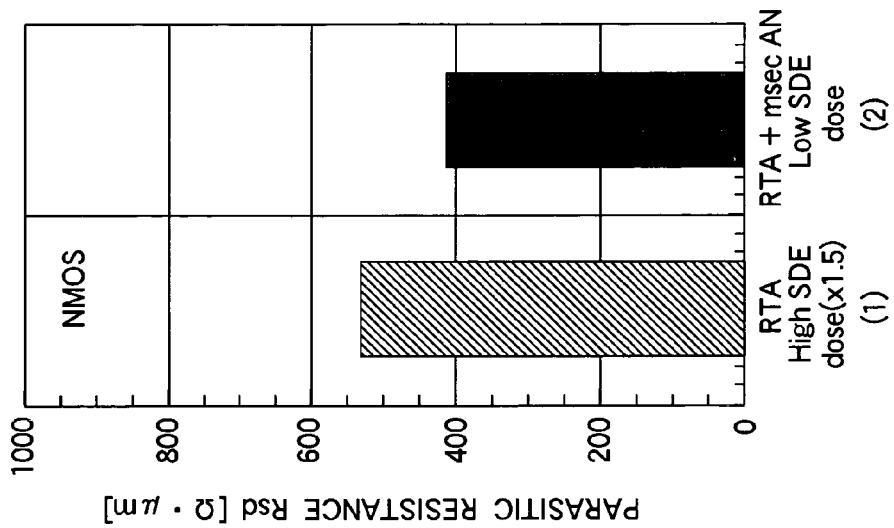
FIGS. 16A and 16B are graphs illustrating source/drain parasitic resistances of the MOS transistors.
Figure 16B:
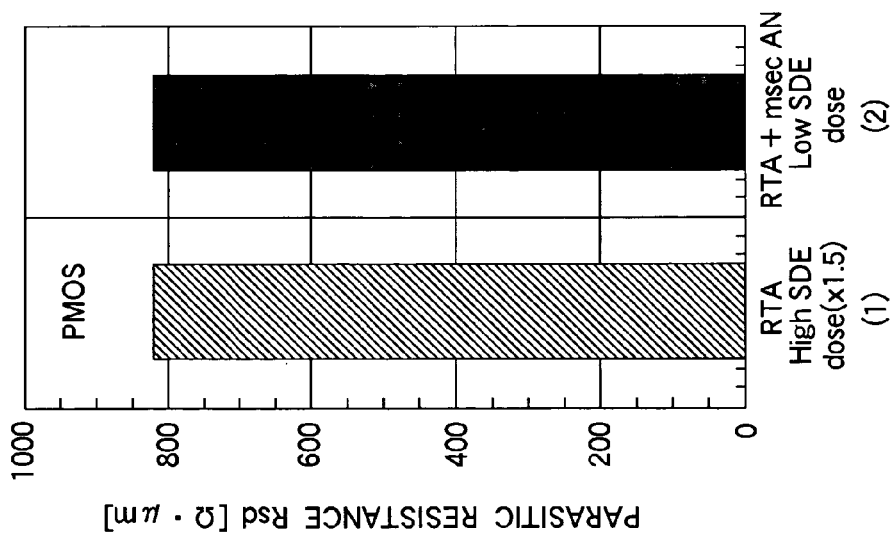

FIG. 16A is a graph illustrating source/drain parasitic resistances Rsd (Ω·µm) of the PMOS transistor. In FIG. 16A, (1) represents a parasitic resistance Rsd of the pMOS transistor ((3) in FIG. 11B) of when the impurity injected in a dosage of $1.5 \times 10^{15}$ cm$^{-2}$ is activated by the rapid thermal annealing only. In FIG. 16A, (2) represents a parasitic resistance Rsd of the pMOS transistor ((2) in FIG. 11B) of when the impurity injected in a dosage of $1.0 \times 10^{15}$ cm$^{-2}$ is activated by the rapid thermal annealing and the millisecond annealing treatment. FIG. 16B is a graph illustrating source/drain parasitic resistances Rsd (Ω·µm) of the nMOS transistor. In FIG. 16B, (1) represents a parasitic resistance Rsd of the nMOS transistor ((3) in FIG. 11A) of when the impurity injected in a dosage of $1.5 \times 10^{15}$ cm$^{-2}$ is activated by the rapid thermal annealing only. In FIG. 16B, (2) represents a parasitic resistance Rsd of the nMOS transistor ((2 in FIG. 11A) of when the impurity injected in a dosage of $1.0 \times 10^{15}$ cm$^{-2}$ is activated by the rapid thermal annealing and the millisecond annealing treatment. As shown in FIGS. 16A and 16B, the source/drain parasitic resistance Rsd of the nMOS transistor is decreased by effecting the millisecond annealing treatment while the source/drain parasitic resistance Rsd of the pMOS transistor does not almost change. As a result, as shown in FIG. 15A, it is considered that in the case of the pMOS transistor, the on current-off current characteristics are not almost improved despite of effecting the millisecond annealing treatment.

The source/drain parasitic resistance Rsd of the pMOS transistor does not almost vary despite of effecting the millisecond annealing treatment probably because the concentration profile of As after the millisecond annealing treatment is relatively steep whereas the concentration profile of B is not so much steep. That is, since the concentration profile of B is not steep, a decrease in the overlapping length Lov results in that a required impurity concentration is not reached in the end portion of the extension region 14 of the pMOS transistor due to a decrease in the resistance Rov.

As described already as the second feature of the embodiment, however, a steep concentration profile of impurity can be formed by introducing a diffusion-controlling substance into the source/drain diffusion layer 22. By introducing the diffusion-controlling substance into the pMOS transistor, therefore, the short channel effect can be suppressed and the on current-off current characteristics can be improved. By introducing the diffusion-controlling substance into the nMOS transistor, further, the short-channel effect can be further suppressed, and the on current-off current characteristics can be further improved.

In this embodiment, there are effected not only the millisecond annealing treatment for enhancing the activity without almost diffusing the impurity but also the annealing treatment based on the rapid thermal annealing that is liable to diffuse the impurity prior to effecting the millisecond annealing treatment. The annealing treatment based on the rapid thermal annealing has advantages in that the impurity diffuses in the gate electrode 6 and that the deep source/drain region 16 can be easily formed. Namely, in this embodiment, an impurity concentration profile is formed by annealing treatment based on the rapid thermal annealing, which is advantageous for suppressing the depletion in the gate electrode 6, for decreasing the contact resistance Rco on the interface of the silicide film 18 and for decreasing the junction leakage current. Thereafter, the millisecond annealing treatment is effected to highly activate the impurity to a degree that cannot be accomplished by the annealing treatment based on the rapid thermal annealing yet maintaining the impurity concentration profile.

Second Embodiment

Figure 17:
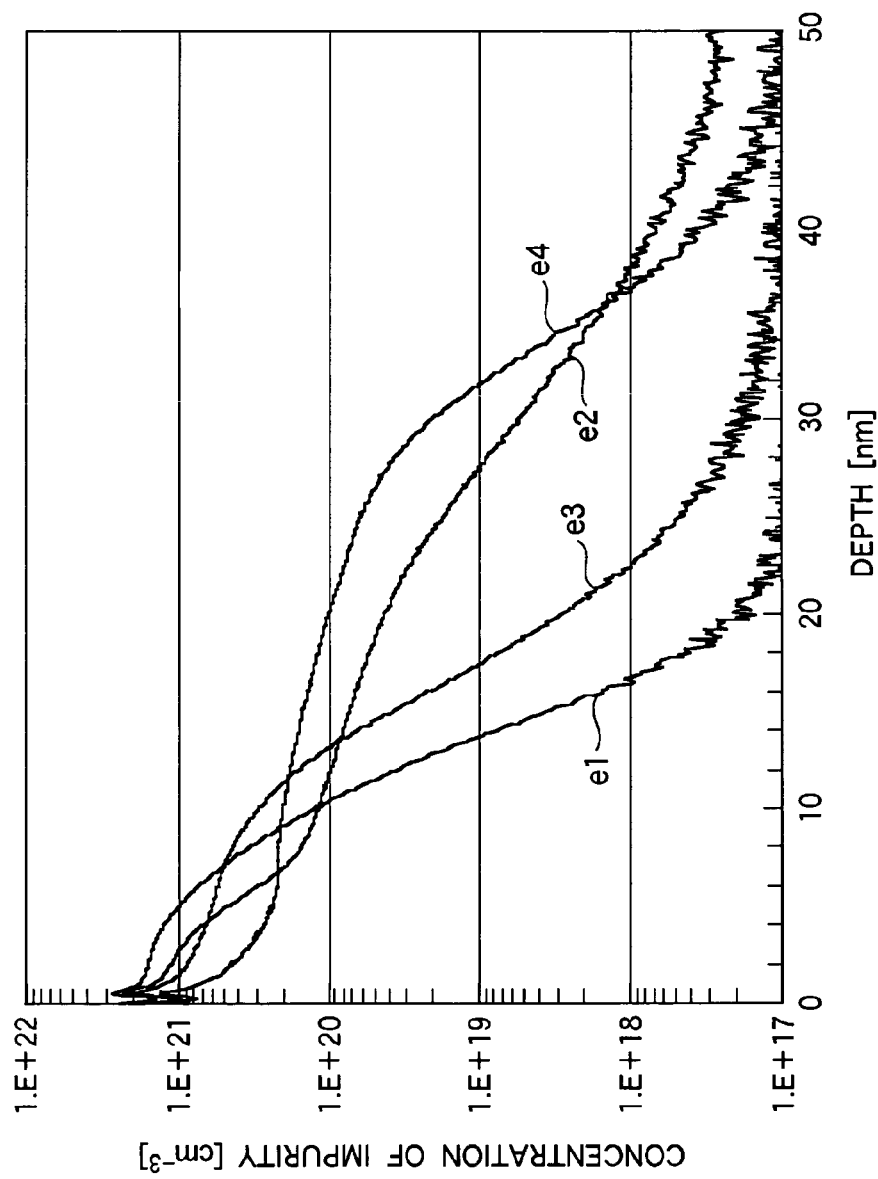
FIG. 17 is a graph illustrating boron concentration profiles.

A method of manufacturing a semiconductor device according to a second embodiment of the invention will be described next with reference to FIGS. 17 to 24. First, described below is a principle of the method of manufacturing the semiconductor device according to the embodiment. FIG. 17 is a graph illustrating concentration profiles of impurity (boron), wherein the abscissa represents the depth (nm) from the surface of the substrate and the ordinate represents the impurity concentration ($cm^{-3}$) in logarithm. A curve e1 represents a concentration profile right after the injection of boron, and a curve e2 represents a concentration profile after the annealing treatment by the rapid thermal annealing method. A curve e3 represents the concentration profile after the millisecond annealing treatment at a annealing temperature of 1350° C., and a curve e4 represents a concentration profile after the millisecond annealing treatment at a annealing temperature of 1350° C. followed by the rapid thermal annealing. It will be learned from FIG. 17 that a high-concentration region of about $1 \times 10^{21}$ $cm^{-3}$ diffuses due to the millisecond annealing treatment (curve e3). Thereafter, upon effecting the annealing treatment by the rapid thermal annealing, there is obtained a very steep impurity concentration profile close to a box shape (curve e4).

In this embodiment, after the impurity (e.g., boron) is injected, the millisecond annealing treatment is effected followed by the annealing treatment which is based on the rapid thermal annealing. Thus, there is obtained a steep impurity concentration profile from an end of the extension region 14 toward the channel direction, and the resistances Rext and Rov can be decreased. By effecting the millisecond annealing treatment again, the impurity can be highly activated. According to this embodiment, therefore, there are obtained a steep impurity concentration profile and highly activated impurity, decreasing the source/drain parasitic resistance to a sufficient degree and realizing a CMOS transistor featuring stable operation and high performance.

Figure 18:
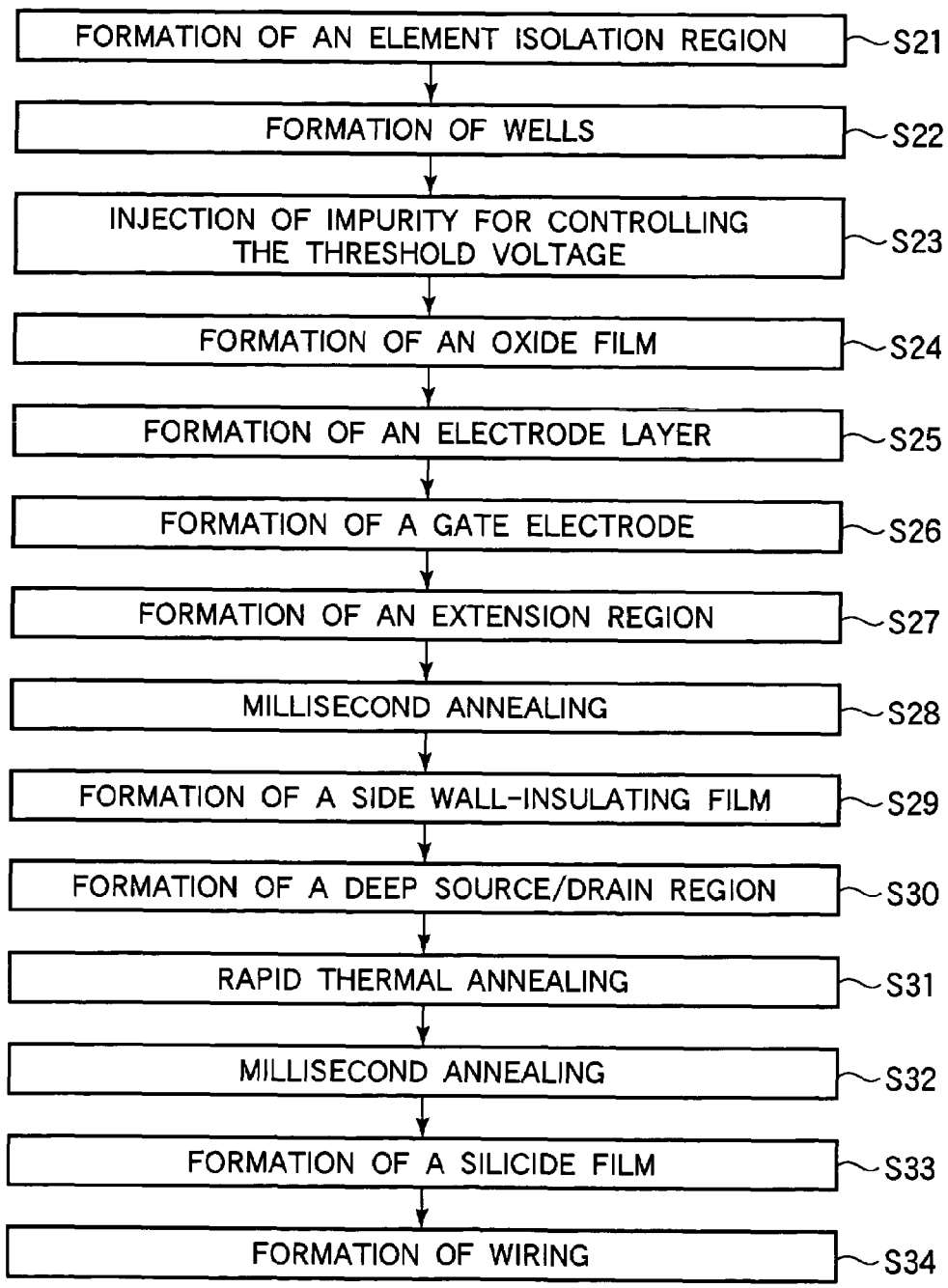
FIG. 18 is a flowchart illustrating a method of manufacturing a semiconductor device according to a second embodiment of the invention.
Figure 19A:
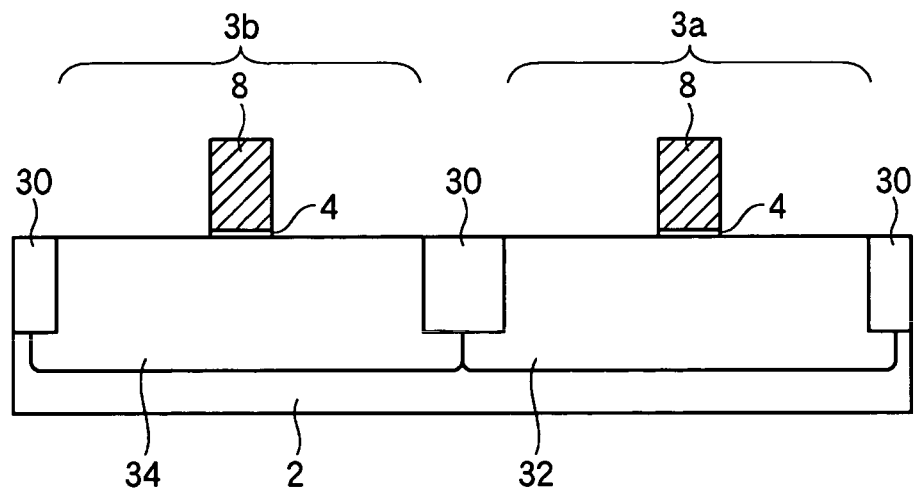
FIGS. 19A and 19B are sectional views illustrating the steps of the method of manufacturing the semiconductor device according to the second embodiment of the invention.

FIG. 18 is a flowchart illustrating a method of manufacturing a semiconductor device according to this embodiment. FIGS. 19A to 23 are sectional views illustrating the steps of the method of manufacturing the semiconductor device according to this embodiment. As shown in FIGS. 18 and 19A, first, a device separation region 30 is formed in the semiconductor substrate 2 by using such as an STI method, and a p-type device forming region 3a and an n-type device forming region 3b are sectionalized (step S21 in FIG. 18, hereinafter the same). Next, a resist layer (not shown) is formed to cover, for example, the n-type device forming region 3b. Thereafter, n-type impurity ions are injected into the p-type device forming region 3a using the resist layer as a mask to form an n-well 32 therein (step S22) followed by the removal of the resist layer covering the n-type device forming region. Next, a resist layer (not shown) is formed to cover the p-type device forming region 3a. By using the above resist layer as a mask, p-type impurity ions are injected into the n-type device forming region 3b to form a p-well 34 therein (step S22) followed by the removal of the resist layer covering the p-type device forming region. Next, impurity ions are injected into the n-well 32 and the p-well 34 at predetermined concentrations to highly precisely control the threshold voltage of the transistor that is to be formed (step S23). Next, an oxide film is formed on the whole surface of the semiconductor substrate 2 relying upon the heat-oxidation method (step S24). Next, a polysilicon film is formed relying upon, for example, a CVD method and an electrode layer is formed on the whole surface of the oxide film (step S25). Thereafter, the electrode layer and the oxide film are patterned to form a polysilicon film 8 (hereinafter often called gate electrode 8) that becomes a major portion of the gate electrode 6 subsequently and a gate-insulating film 4 on both the p-type device forming region 3a and the n-type device forming region 3b (step S26).

Figure 19B:
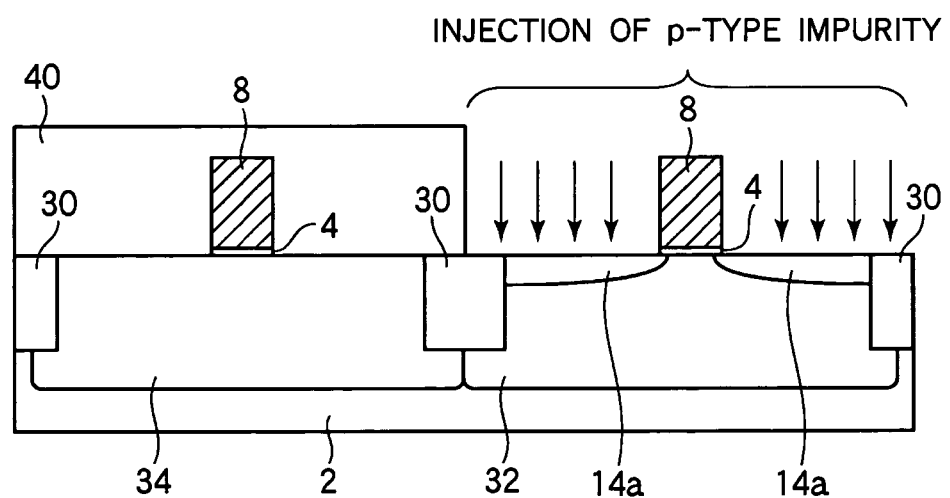

Next, as shown in FIG. 19B, a resist layer 40 is formed to cover, for example, the n-type device forming region 3b. Thereafter, by using the resist layer 40 and the gate electrode 8 as masks, a diffusion-controlling substance such as F or Ge and p-type impurities such as B are introduced into the p-type device forming region relying upon, for example, an ion injection method. The conditions for injecting F are, for example, an acceleration energy of 2 keV and a dosage of $1.00 \times 10^{15}$ $cm^{-2}$, and the conditions for injecting Ge are, for example, an acceleration energy of 2 keV and a dosage of $1.00 \times 10^{15}$ $cm^{-2}$. Further, the conditions for injecting B are an acceleration energy of 0.1 keV to 1 keV and a dosage of $1.00 \times 10^{14}$ $cm^{-2}$ to $1.00 \times 10^{16}$ $cm^{-2}$, such as the acceleration energy of 0.3 keV and a dosage of $1.50 \times 10^{15}$ $cm^{-2}$. Thus, there is formed an extension-forming region 14a of the p-type device forming region 3a (step S27). Here, in this embodiment, too, the diffusion-controlling substance may be introduced like in the first embodiment. The diffusion-controlling substance is introduced into the p-type device forming region 3a relying, for example, upon the ion injection method by using the resist layer 40 and the gate electrode 8 as masks. As the diffusion-controlling substance, there can be used any one of N, Ge, F or C or a combination thereof. The conditions for injecting the diffusion-controlling substance are, for example, an acceleration energy of 0.5 keV to 20 keV and a dosage of $1.00 \times 10^{14}$ $cm^{-2}$ to $1.00 \times 10^{16}$ $cm^{-2}$. Thereafter, the resist layer 40 covering the n-type device forming region 3b is removed.

Figure 20A:
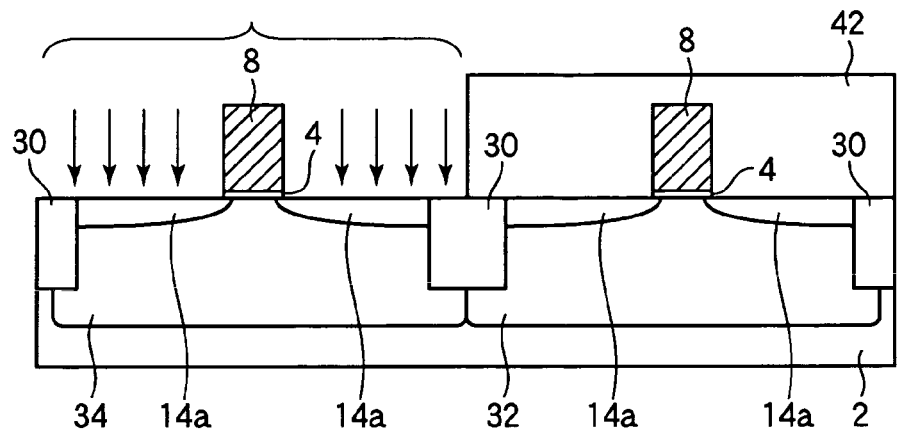
FIGS. 20A and 20B are sectional views illustrating the steps of the method of manufacturing the semiconductor device according to the second embodiment of the invention.

Next, as shown in FIG. 20A, a resist layer 42 is formed to cover the p-type device forming region 3a. Thereafter, by using the resist layer 40 and the gate electrode 8 as masks, n-type impurities such as As are introduced into the n-type device forming region 3b relying upon, for example, the ion injection method. The conditions for injecting As are, for example, an acceleration energy of 0.1 keV to 5 keV and a dosage of $1.00 \times 10^{14}$ $cm^{-2}$ to $1.00 \times 10^{16}$ $cm^{-2}$ and, for example, an acceleration energy of 1.0 keV and a dosage of $1.50 \times 10^{15}$ $cm^{-2}$. Thus, there is formed an extension-forming region 14a of the n-type device forming region 3b (step S27). Here, the diffusion-controlling substance may be introduced in the same manner as described above. The diffusion-controlling substance is introduced into the n-type device forming region 3b relying upon, for example, the ion injection method by using the resist layer 42 and the gate electrode 8 as masks. As the diffusion-controlling substance, there can be used any one of N, Ge, F or C or a combination thereof. The conditions for injecting the diffusion-controlling substance are, for example, an acceleration energy of 0.5 keV to 20 keV, and a dosage of $1.00 \times 10^{14}$ $cm^{-2}$ to $1.00 \times 10^{16}$ $cm^{-2}$. The typical conditions for injecting F are the acceleration energy of 7 keV and the dosage of $5.00 \times 10^{14}$ cm$^{-2}$. Thereafter, the resist layer 42 covering the p-type device forming region 3a is removed.

Figure 20B:
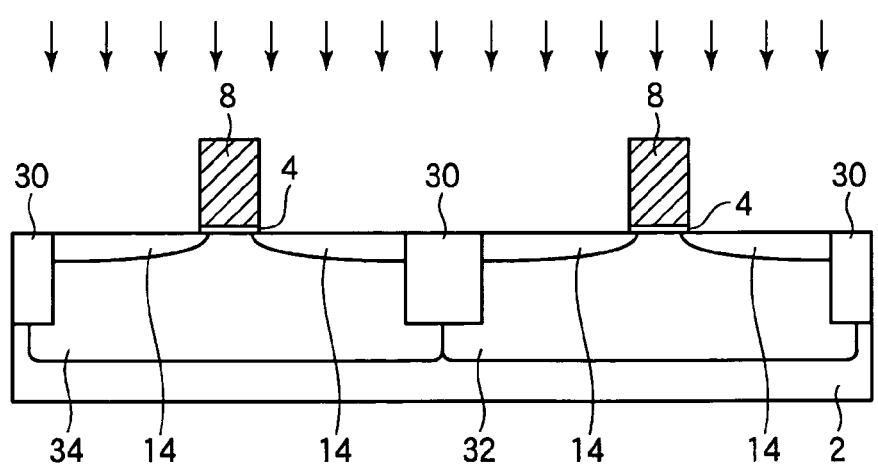

Referring next to FIG. 20B, the millisecond annealing treatment is effected by using the laser annealing system, the LSA system or the FLA system to activate the impurity introduced into the extension-forming region 14a to form an extension region 14 (step S28). The millisecond annealing treatment is effected at an annealing temperature of not lower than 1100° C. but not higher than 1400° C., and at an annealing time of not shorter than 0.01 milliseconds but not longer than 100 milliseconds. In particular, it is desired that the annealing time is not shorter than 0.1 milliseconds but not longer than 10 milliseconds. In this embodiment, the annealing temperature is set to be 1350° C. and the annealing time is set to be 0.2 milliseconds. The region of a high impurity concentration is diffused to some extent by the millisecond annealing treatment, and many of crystal defects caused by the injection of impurity extinguish.

Figure 21A:
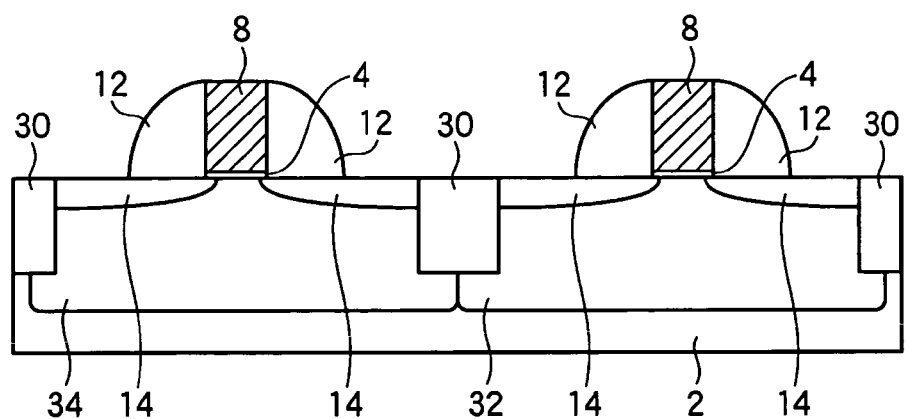
FIGS. 21A and 21B are sectional views illustrating the steps of the method of manufacturing the semiconductor device according to the second embodiment of the invention.

Next, a silicon oxide film is formed on the whole surface of the substrate. Next, the silicon oxide film is removed by anisotropic etching from the regions other than the gate electrode 8 and both side surfaces of the gate-insulating film 4. Thus, side wall-insulating film 12 is formed on each side surface of the gate electrode 8 and the gate-insulating film 4 as shown in FIG. 21A (step S29).

Figure 21B:
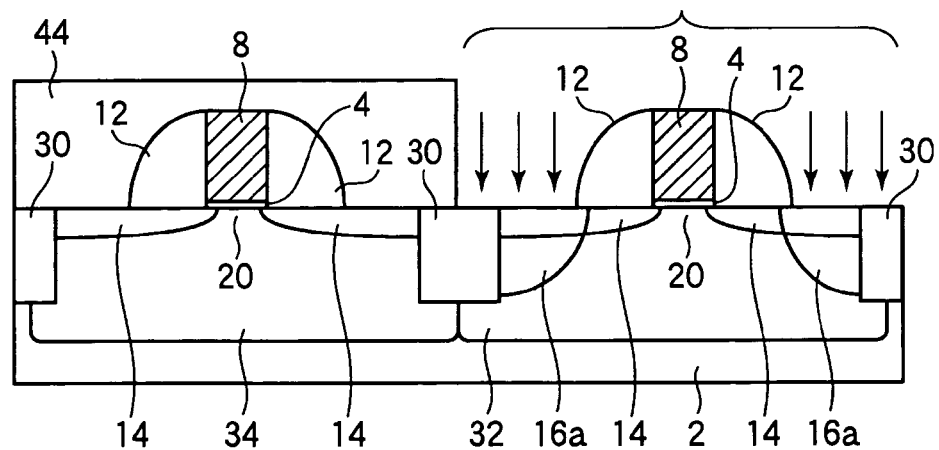

Next, as shown in FIG. 21B, a resist layer 44 is formed to cover, for example, the n-type device forming region 3b. Then, by using, for example, the ion injection method, p-type impurity such as B or In or a combination thereof is introduced into the p-type device forming region 3a by using the resist layer 44, the gate electrode 8 and the side wall-insulating films 12 as masks. The p-type impurity is injected with an acceleration energy and in a dosage that are greater than those for the p-type impurity injected into the extension region 14. Thus, there is formed a deep source/drain forming region 16a into where the p-type impurity is deeply introduced (step S30). Thereafter, the resist layer 44 covering the n-type device forming region 3b is removed.

Figure 22A:
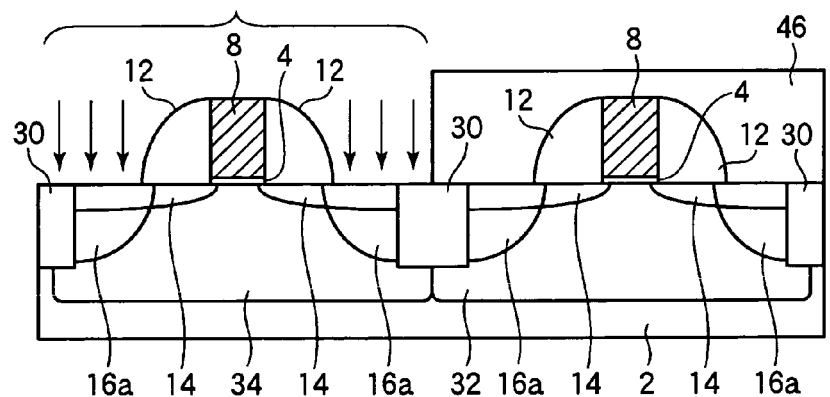
FIGS. 22A and 22B are sectional views illustrating the steps of the method of manufacturing the semiconductor device according to the second embodiment of the invention.

Next, as shown in FIG. 22A, a resist layer 46 is formed to cover the p-type device forming region 3a. Then, by using, for example, the ion injection method, n-type impurity such as As or P or a combination thereof is introduced into the n-type device forming region 3b by using the resist layer 46, the gate electrode 8 and the side wall-insulating films 12 as masks. The n-type impurity is injected with an acceleration energy and in a dosage that are greater than those for the n-type impurity injected into the extension region 14. Thus, there is formed a deep source/drain forming region 16a into where the n-type impurity is deeply introduced (step S30). Thereafter, the resist layer 46 covering the p-type device forming region 3a is removed.

Figure 22B:
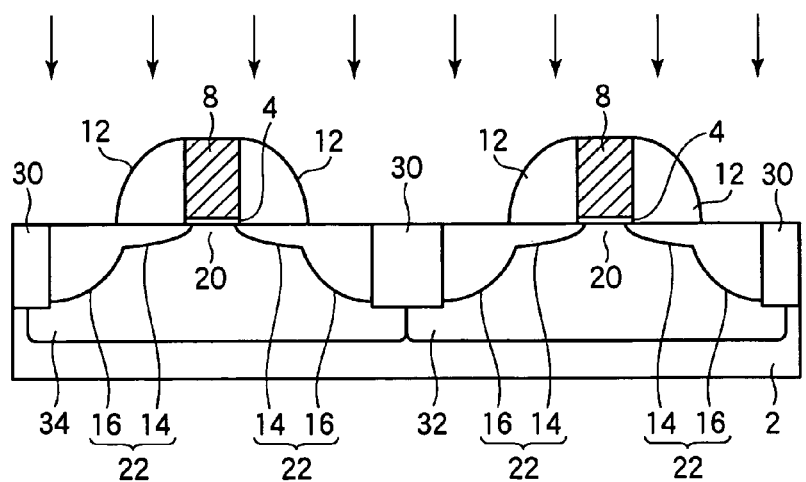

Referring next to FIG. 22B, the annealing treatment is effected by using the rapid thermal annealing system to diffuse and activate the injected impurity (step S31). The annealing treatment is effected at an annealing temperature of not lower than 900° C. but not higher than 1100° C., and at an annealing time of not shorter than 0.1 seconds but not longer than 10 seconds. Many of the crystal defects extinguish due to the millisecond annealing treatment at step S28. Therefore, the impurity is not undesirably diffused by the annealing treatment. There is, hence, obtained an impurity concentration profile close to a box shape. Through these steps, the source/drain diffusion layers 22 having the extension region 14 and the deep source/drain region 16 are formed in both the p-type device forming region 3a and the n-type device forming region 3b.

Figure 23:
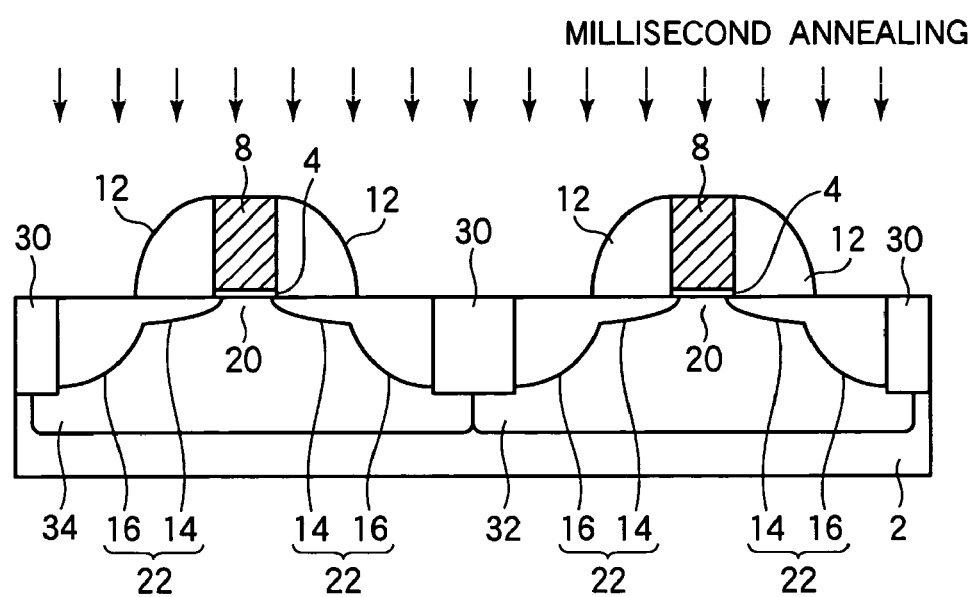
FIG. 23 is a sectional view illustrating a step of the method of manufacturing the semiconductor device according to the second embodiment of the invention.

Here, as shown in FIG. 23, the millisecond annealing treatment may be effected again by using the LSA system or the LFA system (step S32). After the rapid thermal annealing at step S31, the millisecond annealing treatment is effected to further highly activate the impurity yet maintaining an impurity concentration profile close to a box shape. The millisecond annealing treatment is effected at an annealing temperature of not lower than 1100° C. but not higher than 1400° C., and at an annealing time of not shorter than 0.01 milliseconds but not longer than 100 milliseconds. In particular, it is desired that the annealing time is not shorter than 0.1 milliseconds but is not longer than 10 milliseconds. In this embodiment, the annealing temperature is 1350° C. and the annealing time is 0.2 milliseconds.

Next, a metal film such as of cobalt or nickel is formed on the whole surface of the substrate. Next, the semiconductor substrate 2 is heated to react the metal film, silicon film and silicon substrate on a region where they come in contact with each other. Thereafter, the metal film is removed from the unreacted portions. Therefore, the silicide films 10 and 18 are formed on the gate electrode 6 and on the source/drain diffusion layer 22, and the gate electrode 6 is formed having the polysilicon film 8 and the silicide film 10 laminated in this order (step S33). Thereafter, a predetermined wiring structure is formed by using an insulating film and a conducting film (step S34). A semiconductor device having a CMOS transistor is fabricated through the above steps.

The pMOSFETs were fabricated according to the method of manufacturing semiconductor devices of the embodiment and according to the method of manufacturing the semiconductor device of Comparative Example without effecting the millisecond annealing treatment at step S28. The millisecond annealing treatment of step S32 was effected in none of the methods. F, Ge and B were used as impurity to be injected into the extension region 14. The conditions for injecting F and Ge were the acceleration energy of 2 keV and the dosage of $1.00 \times 10^{15}$ cm$^{-2}$, and the conditions for injecting B were the acceleration energy of 0.3 keV and the dosage of $1.50 \times 10^{15}$ cm$^{-2}$. The millisecond annealing treatment at step S28 was conducted at an annealing temperature of 1320° C., and at an annealing time of 0.8 milliseconds. The designed gate length of the transistor was 35 nm and the designed gate width was 1 μm.

Figure 24:
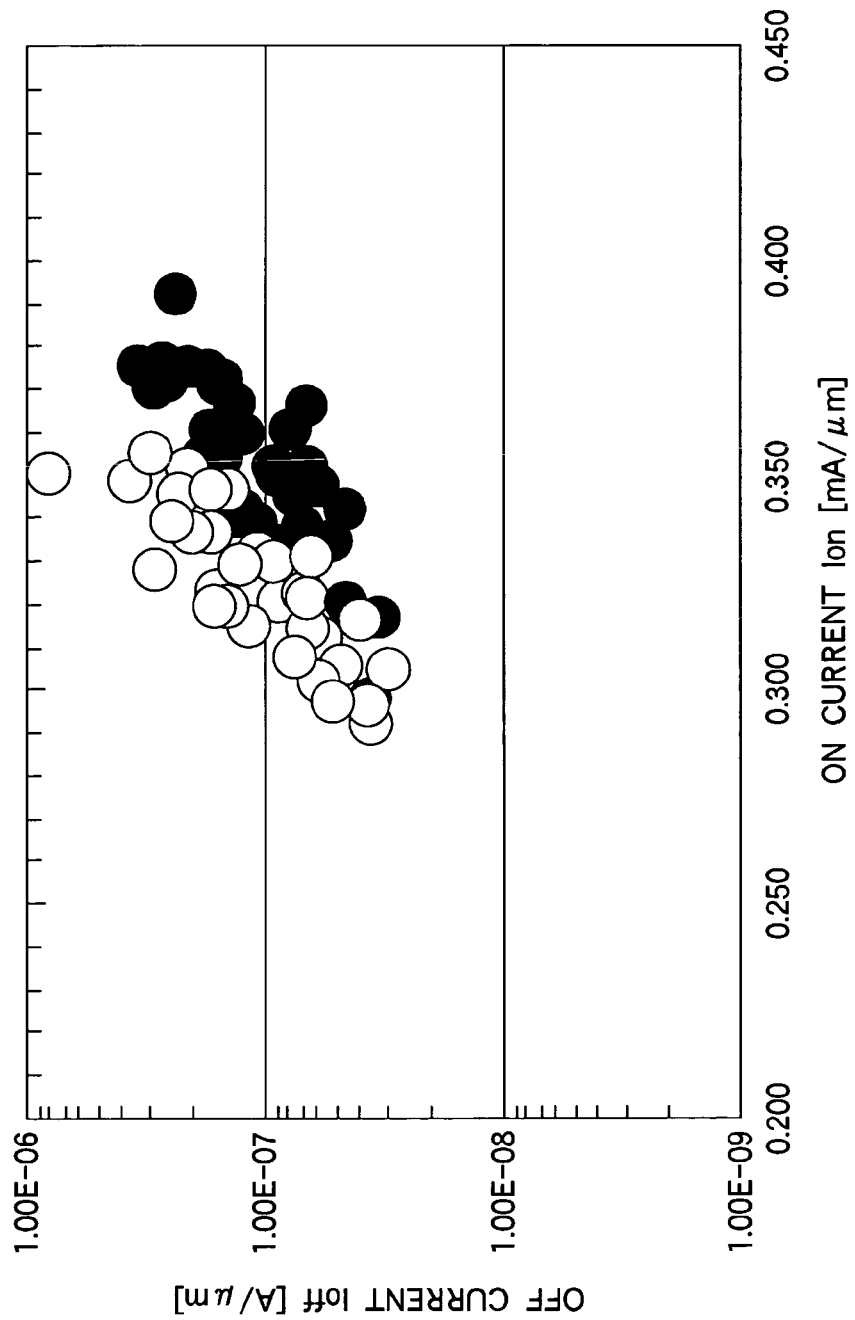
FIG. 24 is a graph illustrating on current-off current characteristics of a PMOSFET.

FIG. 24 is a graph illustrating on current-off current characteristics of the PMOSFET that is fabricated, wherein the abscissa represents the on current Ion (mA/μm) and the ordinate represents the off current Ioff (A/μm) as logarithm. Black circles represent on current-off current characteristics of the pMOSFET fabricated by the method of manufacturing the semiconductor device of the embodiment, and open circles represent on current-off current characteristics of the pMOSFET fabricated by the method of manufacturing the semiconductor device of Comparative Example. The gate voltage Vg is 0 V and the drain voltage Vd is −1.0 V in the off state. The gate voltage Vg is −1.0 V and the drain voltage Vd is −1.0 V in the on state. The graph shows that the performance is high then the on current Ion is great with respect to the same off current Ioff. It will be learned from FIG. 24 that the PMOSFET fabricated by the method of manufacturing semiconductors of the embodiment has an on current Ion which is increased by about 10% with respect to the same off current Ioff as compared to that of the PMOSFET fabricated by the method of manufacturing the semiconductor device of Comparative Example. This is because, a steep impurity concentration profile is obtained as represented by a curve e4 in FIG. 17 as a result of effecting the rapid thermal annealing after the millisecond annealing treatment and, hence, the extension region 14 of a low resistance is formed.

Third Embodiment

Figure 25:
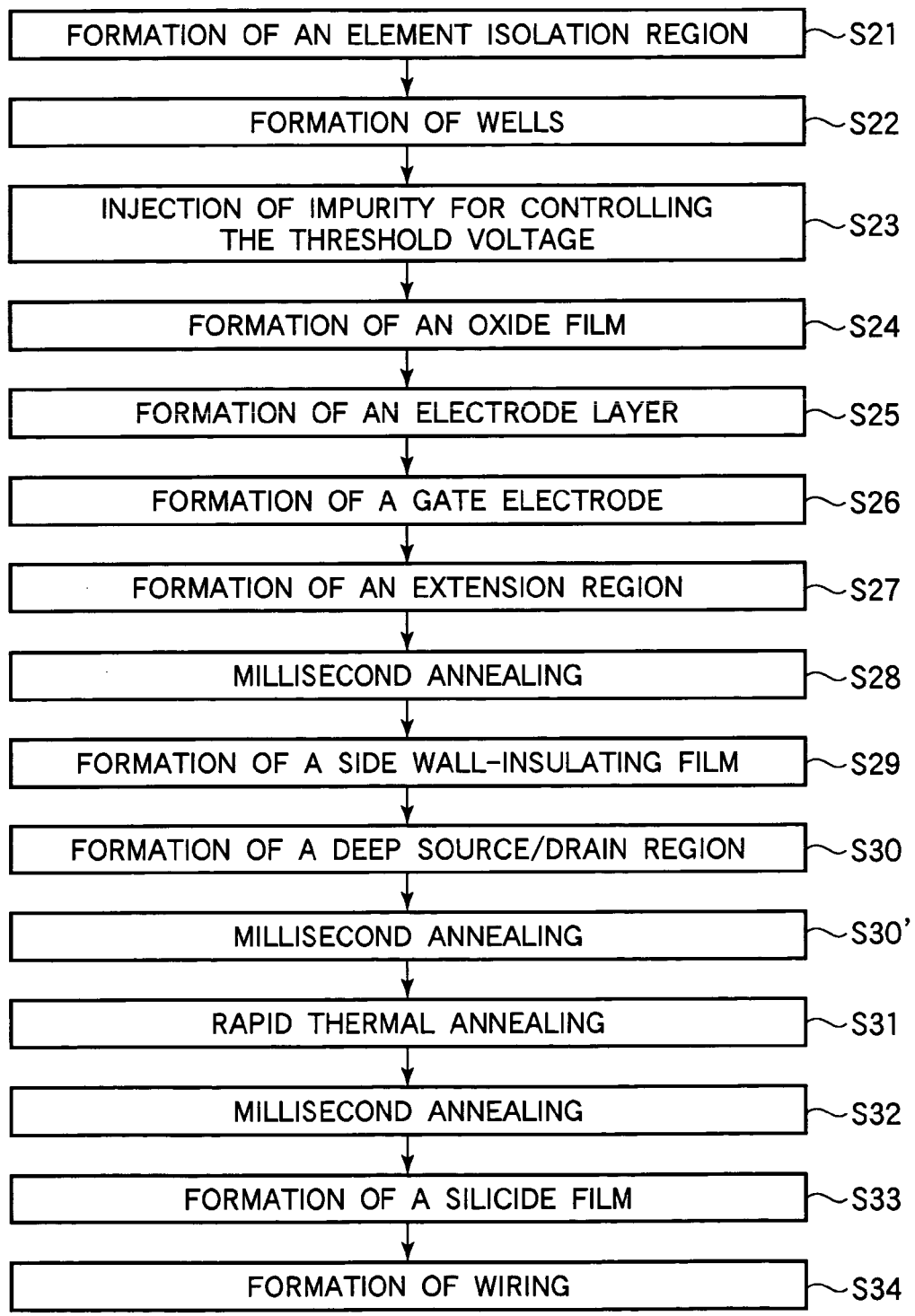
FIG. 25 is a flowchart illustrating a method of manufacturing a semiconductor device according to a third embodiment of the invention.

A method of manufacturing a semiconductor device according to a third embodiment of the invention will be described next with reference to FIGS. 25 and 26. FIG. 25 is a flowchart illustrating a method of manufacturing a semiconductor device according to this embodiment. The flowchart shown in FIG. 25 has a feature which resides in adding a Step 30'carrying out a millisecond annealing treatment after the deep source/drain region has been formed at Step S30 and before the rapid thermal annealing at Step S31 as shown in the flowchart of FIG. 18 of the second embodiment. That is, as shown in FIG. 18, the second embodiment includes the steps of effecting a millisecond annealing treatment after the extension region forming step (Step S27) and after the rapid thermal annealing step (Step S31). This embodiment includes, further, a step of effecting a millisecond annealing treatment after the deep source/drain region forming step (Step S30) and before the rapid thermal annealing step (Step S31).

Also, there can be used any one of N, Ge, F or C or a combination thereof as the diffusion-controlling substance with a dopant on the ion injection for forming the deep source/drain region at Step S30. The conditions for injecting these substances are, for example, an acceleration energy of 0.5 keV to 20 keV, and a dosage of $1.00 \times 10^{14}$ cm$^{-2}$ to $1.00 \times 10^{16}$ cm$^{-2}$. By this, since the deep source/drain region of a low resistance is formed, the resistances Rdp and Rco can be decreased. By effecting the millisecond annealing treatment (Step S32) again, the impurity can be highly activated. It is possible to decrease the resistances Rdp and Rco, if the millisecond annealing treatment step S28 after the extension region forming step (Step S27) is skipped.

Next, the specific conditions of the ion injection for forming the deep source/drain region at Step S30 will be described as follows. First, the conditions at an n-type device forming region for forming nMOSFETs (see, for example, FIG. 20A) will be explained. The conditions for injecting P are the acceleration energy of 2 keV to 12 keV and the dosage of $6.00 \times 10^{15}$ cm$^{-2}$ to $1.20 \times 10^{16}$ cm$^{-2}$. At the same time, any one of N, Ge, F or C or a combination thereof is injected by the ion injection method. The conditions for injecting these substances are, for example, an acceleration energy of 0.5 keV to 20 keV, and a dosage of $1.00 \times 10^{14}$ cm$^{-2}$ to $1.00 \times 10^{16}$ cm$^{-2}$. Next, the conditions at a p-type device forming region for forming pMOSFETs (see, for example, FIG. 19B) will be explained. The conditions for injecting B are the acceleration energy of 1 keV to 4 keV and the dosage of $2.00 \times 10^{15}$ cm$^{-2}$ to $8.00 \times 10^{15}$ cm$^{-2}$. At the same time, any one of N, Ge, F or C or a combination thereof is injected by the ion injection method. The conditions for injecting these substances are, for example, an acceleration energy of 0.5 keV to 20 keV, and a dosage of $1.00 \times 10^{14}$ cm$^{-2}$ to $1.00 \times 10^{16}$ cm$^{-2}$.

The millisecond annealing treatment in the Step S30' of FIG. 25 is effected at an annealing temperature of not lower than 1100° C. but not higher than 1400° C., and at an annealing time of not shorter than 0.01 milliseconds but not longer than 100 milliseconds. In particular, it is desired that the annealing time is not shorter than 0.1 milliseconds but is not longer than 10 milliseconds. In this embodiment, the annealing temperature is 1220° C. and the annealing time is 0.8 milliseconds.

The nMOSFETs were fabricated according to the method of manufacturing semiconductor devices of the embodiment shown in the processing flow of FIG. 25 and according to the method of manufacturing the semiconductor device of Comparative Example without effecting the millisecond annealing treatment at step S30'. The millisecond annealing treatment of step S32 was effected in none of the methods, but the millisecond annealing treatment of step S28 was effected in both of the methods. F and P were used as impurity to be injected into the deep source/drain region 16. The conditions for injecting F were the acceleration energy of 7 keV and the dosage of $5.00 \times 10^{14}$ cm$^{-2}$, and the conditions for injecting P were the acceleration energy of 8 keV and the dosage of $1.20 \times 10^{16}$ cm$^{-2}$. The millisecond annealing treatment at step S30' was conducted at an annealing temperature of 1220° C., and at an annealing time of 0.8 milliseconds.

Figure 26:
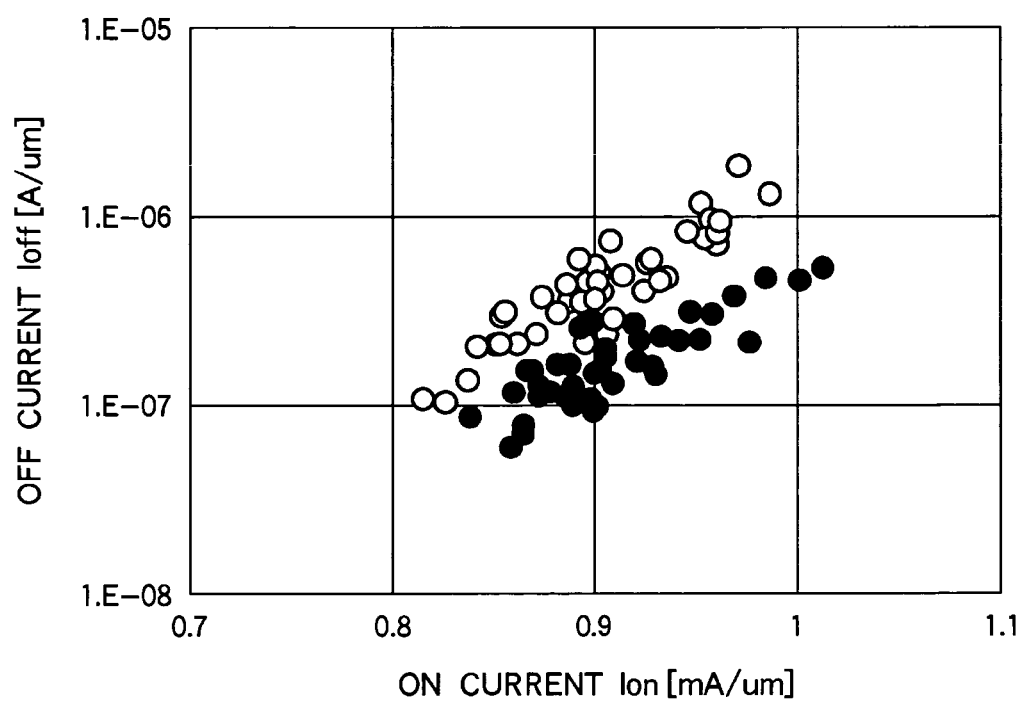
FIG. 26 is a graph illustrating on current-off current characteristics of a nMOSFET.

FIG. 26 is a graph illustrating on current-off current characteristics of the nMOSFET that is fabricated. The designed gate length of the transistor was 30 nm and the designed gate width was 1 μm. The abscissa represents the on current Ion (mA/μm) and the ordinate represents the off current Ioff (A/μm) as logarithm. Black circles represent on current-off current characteristics of the nMOSFET fabricated by the method of manufacturing the semiconductor device of the embodiment including Step S30', and open circles represent on current-off current characteristics of the nMOSFET fabricated by the method of manufacturing the semiconductor device of Comparative Example which does not execute the Step S30'. The gate voltage Vg is 0 V and the drain voltage Vd is 1.0 V in the off state. The gate voltage Vg is 1.0 V and the drain voltage Vd is 1.0 V in the on state. The graph shows that the performance is high then the on current Ion is great with respect to the same off current Ioff. It will be learned from FIG. 26 that the nMOSFET fabricated by the method of manufacturing semiconductors of the embodiment having Step S30' has an on current Ion which is increased by about 7% with respect to the same off current Ioff as compared to that of the MOSFET fabricated by the method of manufacturing the semiconductor device of Comparative Example which does not have Step S30'. This is because, a modulation of steep impurity concentration profile of P along with B is obtained as represented by a curve e4 in FIG. 17 as a result of effecting the rapid thermal annealing after the millisecond annealing treatment which is effected after the injection of F with the typical conditions for injecting that are the acceleration energy of 7 keV and the dosage of $5.00 \times 10^{14}$ cm$^{-2}$, hence, the deep source/drain region of a low resistance is formed. That is, the resistances Rdp and Rco as shown in FIG. 27 can be decreased.

The present invention can be varied in a variety of ways not being limited to the above embodiments only.

The above embodiments have dealt with the method of manufacturing semiconductor devices having a CMOS transistor. Not being limited thereto only, however, the invention can be further applied to the method of manufacturing the semiconductor device having an nMOS transistor only or a PMOS transistor only.

What is claimed is:

1. A method of manufacturing a semiconductor device comprising the steps of:
   forming a gate electrode on a semiconductor substrate via a gate-insulating film;
   introducing a first impurity into the semiconductor substrate using the gate electrode as a mask;
   introducing a diffusion-controlling substance into the semiconductor substrate to control a diffusion of the first impurity;

forming a side wall-insulating film on each side surface of the gate electrode;

introducing a second impurity of the same conductivity type as the first impurity into the semiconductor substrate deeper than an introduced portion of the first impurity using the gate electrode and the side wall-insulating film as masks;

activating the first and second impurities by a first annealing treatment; and further activating the first and/or second impurities by a second annealing treatment of an annealing time of not longer than 100 milliseconds.

2. The method of manufacturing the semiconductor device according to claim 1, wherein the second annealing treatment is effected before and/or after the second impurity is introduced into the semiconductor substrate.

3. The method of manufacturing the semiconductor device according to claim 1, wherein the diffusion-controlling substance is introduced into the semiconductor substrate before and/or after the second impurity is introduced into the semiconductor substrate.

4. The method of manufacturing the semiconductor device according to claim 1, wherein the annealing time in the second annealing treatment is not shorter than 0.01 milliseconds.

5. The method of manufacturing the semiconductor device according to claim 4, wherein the annealing time in the second annealing treatment is not shorter than 0.1 milliseconds but is not longer than 10 milliseconds.

6. The method of manufacturing the semiconductor device according to claim 1, wherein an annealing temperature in the second annealing treatment is not lower than 1100° C. but is not higher than 1400° C.

7. The method of manufacturing the semiconductor device according to claim 1, wherein the second annealing treatment is effected by using a laser spike annealing system or a flash lamp annealing system.

8. The method of manufacturing the semiconductor device according to claim 1, wherein an annealing time in the first annealing treatment is not shorter than 0.1 seconds but is not longer than 10 seconds.

9. The method of manufacturing the semiconductor device according to claim 1, wherein an annealing temperature in the first annealing treatment is not lower than 900° C. but is not higher than 1100° C.

10. The method of manufacturing the semiconductor device according to claim 1, wherein the first annealing treatment is effected by using a rapid thermal annealing system.

11. A method of manufacturing a semiconductor device comprising the steps of:

forming a gate electrode on a semiconductor substrate via a gate-insulating film;

introducing a first impurity into the semiconductor substrate using the gate electrode as a mask;

activating the first impurity by a first annealing treatment of an annealing time of not longer than 100 milliseconds;

forming a side wall-insulating film on each side surface of the gate electrode;

introducing a second impurity of the same conductive type as the first impurity into the semiconductor substrate deeper than an introduced portion of the first impurity using the gate electrode and the side wall-insulating film as masks;

introducing a diffusion-controlling substance into the semiconductor substrate to control a diffusion of the first impurity in the step of introducing the second impurity; and further activating the first impurity while activating the second impurity by a second annealing treatment.

12. The method of manufacturing the semiconductor device according to claim 11, wherein the annealing time in the first annealing treatment is not shorter than 0.01 milliseconds.

13. The method of manufacturing the semiconductor device according to claim 12, wherein the annealing time in the first annealing treatment is not shorter than 0.1 milliseconds but is not longer than 10 milliseconds.

14. The method of manufacturing the semiconductor device according to claim 11, wherein an annealing temperature in the first annealing treatment is not lower than 1100° C. but is not higher than 1400° C.

15. The method of manufacturing the semiconductor device according to claim 11, wherein the first annealing treatment is effected by using a laser annealing system, a laser spike annealing system or a flash lamp annealing system.

16. The method of manufacturing the semiconductor device according to claim 11, wherein an annealing time in the second annealing treatment is not shorter than 0.1 seconds but is not longer than 10 seconds.

17. The method of manufacturing the semiconductor device according to claim 11, wherein an annealing temperature in the second annealing treatment is not lower than 900° C. but is not higher than 1100° C.

18. The method of manufacturing the semiconductor device according to claim 11, wherein the second annealing treatment is effected by using a rapid thermal annealing system.

19. The method of manufacturing the semiconductor device according to claim 11, further comprising the step of conducting a third annealing treatment of an annealing time of not longer than 100 milliseconds is effected before and/or after the second annealing treatment.

20. The method of manufacturing the semiconductor device according to claim 19, wherein the annealing time in the third annealing treatment is not shorter than 0.01 milliseconds.

21. The method of manufacturing the semiconductor device according to claim 20, wherein the annealing time in the third annealing treatment is not shorter than 0.1 milliseconds but is not longer than 10 milliseconds.

22. The method of manufacturing the semiconductor device according to claim 19, wherein an annealing temperature in the third annealing treatment is not lower than 1100° C. but is not higher than 1400° C.

* * * * *